US007181715B2

(12) United States Patent
Sato et al.

(10) Patent No.: US 7,181,715 B2
(45) Date of Patent: Feb. 20, 2007

(54) METHOD AND SYSTEM FOR SUPPORTING CIRCUIT DESIGN FOR PRODUCTS

(75) Inventors: Seiki Sato, Tokyo (JP); Masaru Tange, Tokyo (JP); Hiroaki Tsutsumi, Tokyo (JP); Yoh-ichi Kobayashi, Tokyo (JP)

(73) Assignee: INCS, Inc., Kanagawa (JP)

( * ) Notice: Subject to any disclaimer, the term of this patent is extended or adjusted under 35 U.S.C. 154(b) by 379 days.

(21) Appl. No.: 10/884,790

(22) Filed: Jul. 1, 2004

(65) Prior Publication Data
US 2005/0022147 A1 Jan. 27, 2005

(30) Foreign Application Priority Data
Jul. 24, 2003 (JP) ............................. 2003-200877

(51) Int. Cl.
*G06F 17/50* (2006.01)
(52) U.S. Cl. ............................... 716/11; 716/1; 716/18
(58) Field of Classification Search ................... 716/11, 716/1, 18
See application file for complete search history.

(56) References Cited

U.S. PATENT DOCUMENTS

| 5,555,201 | A | * | 9/1996 | Dangelo et al. | ................ | 716/1 |
| 5,623,418 | A | * | 4/1997 | Rostoker et al. | ................ | 716/1 |
| 5,875,112 | A |   | 2/1999 | Lee |   |   |
| 6,484,292 | B1 |   | 11/2002 | Jain et al. |   |   |
| 6,496,957 | B1 | * | 12/2002 | Kumagai | ........................ | 716/4 |
| 6,536,012 | B1 | * | 3/2003 | Mizuno | ........................... | 716/1 |

2002/0156757 A1 * 10/2002 Brown ........................... 707/1

OTHER PUBLICATIONS

Walker M G et al: "Computer-Aided Engineering for Analog Circuit Design" Computer, IEEE Computer Society, Long Beach., CA, US, US, vol. 19 No. 4, Apr. 1, 1986, pp. 100-108, XP000743505 ISSN: 0018-9162 "The Whole Document".
Chawla P et al: "Automated Reuse Support for Design of Embedded Avionics Systems" Mar. 20, 2001, pp. 2857-2862, XP010548408 "The Whole Document".

* cited by examiner

*Primary Examiner*—Sun James Lin
(74) *Attorney, Agent, or Firm*—Martin Fleit; Paul D. Bianco; Fleit Kain Gibbons Gutman Bongini & Bianco P.L.

(57) ABSTRACT

A design support method allows even inexperienced design engineers to design at a standard or higher quality level within a reduced design period of time. A setup step registers in a database the correlations of design specifications, circuit components and design items, which are required for the circuit design of a product. A design-specification determination step prompts a design engineer to determine the content of the design specifications. A circuit-component determination step prompts the design engineer to determine circuit components in accordance with the correlations between the design specifications and the circuit components. A design-item extraction step extracts design items required for a specific version of the product in accordance with the correlations between the design item and the design specification or circuit component, registered in the setup step, and presents the extracted design items to the design engineer. A design-item execution step presents to the design engineer specific job content extracted in the design-item extraction step, and naviates and prompting prompts the design engineer to execute the job content.

20 Claims, 33 Drawing Sheets

FIG.7

ADD NECESSARY CONDITION

DESIGN ITEM SUBJECT TO ADDITION OF NECESSARY CONDITION: Design Item 1-1-1

UNIT SELECTION [Body]

COMPONENT LIST

| Sub-Unit Name | Component Name | Component Type Name | Component Number | Cost | Material |
|---|---|---|---|---|---|
| ☐ | component 1 | type A | IN0001 | 100 | ABS |
| ☐ | component 1 | type B | IN0002 | 120 | ABS |
| ☐ | component 2 | type A | IN0001 | 30 | ABS |
| ☐ | component 2 | type B | IN0002 | 20 | ABS |
| ☐ | component 3 | type A | IN0005 | 50 | ABS |
| ☐ | component 3 | type B | IN0006 | 60 | ABS |
| ☐ | component 4 | type A | IN0007 | 80 | ABS |
| ☐ | component 4 | type B | IN0008 | 90 | ABS |
| ☐ | component 5 | type A | IN0009 | 200 | ABS |
| ☐ | component 5 | type B | IN0010 | 210 | ABS |
| ☐ | component 6 | type A | IN0011 | 140 | ABS |
| ☐ | component 6 | type B | IN0012 | 100 | ABS |
| ☐ | component 7 | type A | IN0013 | 10 | ABS |
| ☐ | component 7 | type B | IN0014 | 15 | ABS |
| ☐ | component 8 | type A | IN0015 | 50 | ABS |
| ☐ | component 8 | type B | IN0016 | 70 | ABS |

CLEAR

Design Specification List

| | Design specification Name | Design information Value | Unit |
|---|---|---|---|
| ☑ | design specification 1 | value 1a | — |
| ☐ | design specification 1 | value 1b | — |
| ☐ | design specification 2 | value 2a | — |
| ☐ | design specification 2 | value 2b | — |
| ☐ | design specification 3 | value 3a | — |
| ☐ | design specification 3 | value 3b | — |
| ☐ | design specification 4 | value 4a | — |
| ☐ | design specification 4 | value 4b | — |
| ☐ | design specification 5 | value 5a | — |
| ☐ | design specification 5 | value 5b | — |
| ☐ | countermeasure 1 | value 1α | — |
| ☐ | countermeasure 1 | value 1β | — |
| ☐ | countermeasure 2 | value 2α | — |
| ☐ | countermeasure 2 | value 2β | — |
| ☐ | countermeasure 3 | value 3α | — |
| ☐ | countermeasure 3 | value 3β | — |

CLEAR

APPLY    CANCEL

FIG.15

All Component List

Please select component to be added, and push ⊚ button

| Unit Name | Sub-Unit Name | Component Name | Component Type Name | Component Number | Cost | Material |
|---|---|---|---|---|---|---|
| circuit body | | circuit composing component2 | Type A | 34A355 | 300 | Fe |
| circuit body | | circuit composing component3 | Type B | 231432 | 40 | mica |
| circuit body | | circuit composing component1 | Type A | IN0001 | 100 | carbon film |
| circuit body | | circuit composing component5 | Type A | 335456 | 540 | ceramic |
| circuit body | | circuit composing component6 | Type B | 123BF4 | 5 | film oxide |
| circuit body | | circuit composing component9 | Type A | 439568 | 540 | carbon |
| circuit body | | circuit composing component4 | Type A | 43TR69 | 3000 | FPGA |
| circuit body | | circuit composing component8 | Type B | AD4544 | 0 | |
| circuit body | | circuit composing component7 | Type A | 423AA3 | 420 | |

FIG.21

JOB-OS - Microsoft Internet Explorer
ファイル(F) 編集(E) 表示(V) お気に入り(A) ツール(T) ヘルプ(H)

DETAILED DESIGN LIST

| ID | 0000 |
|---|---|
| User Name | user |
| Product Name | circuit design |
| Login Time | 2003/05/07 13:27:48 |

⇐ RETURN

─ Development-02 ─────────────────────────

Select task                                                          10/11

| No | | Status | Development Version | Unit | Component | Design Item | Recorded Time | Preparer | Completion Date |
|---|---|---|---|---|---|---|---|---|---|
| 1 | ⊙ | design completion | development-02 | body | component 1 | design item 1-1-1 | 00:00:00 | user | 2003/05/07 20:33:42 |
| 2 | ○ | designable (or design OK) | development-02 | body | component 1 | design item 1-1-2 | 00:06:00 | | |
| 3 | ○ | undesignable (or design NG) | development-02 | body | component 1 | design item 1-2-1 | 00:00:00 | | |
| 4 | ○ | designable (or design OK) | development-02 | body | component 1 | design item 1-2-2 | 00:00:00 | | |
| 5 | ○ | undesignable (or design NG) | development-02 | body | component 1 | design item 1-3-1 | 00:00:00 | | |
| 6 | ○ | designable (or design OK) | development-02 | body | component 2 | design item 2-1-2 | 00:00:00 | | |
| 7 | ○ | undesignable (or design NG) | development-02 | body | component 2 | design item 2-2-2 | 00:00:00 | | |
| 8 | ○ | designable (or design OK) | development-02 | body | component 1 | design item 2-1-2 | 00:00:00 | | |
| 9 | ○ | undesignable (or design NG) | development-02 | body | component 2 | design item 2-2-2 | 00:00:00 | | |
| 10 | ○ | undesignable (or design NG) | | | | | | | |

🔍 Extraction | all items ▾ | all items ▾ | all items ▾ | all items ▾ | all items ▾

◎ Detailed design  ⚙ Flow View  ↻ Re-Load                    Next ⇨

FIG.23

| Design Item | AFC CIRCUIT DESIGN | Preparer | 堤 寛朗 |
|---|---|---|---|
| シートNo | A01-01-01 | Creation Date | 2003/5/26 |

Design Item Supplementary Explanation

衛星通信・移動体通信にこのPSK方式を用いた場合、中継機の周波数変動やドップラシフトの影響で生じる周波数誤差が問題となる。
大きな周波数誤差が生じた時に必要となる回路がAFC(Automatic Frequency Control)回路とよばれるもので、周波数誤差信号を検知し、その周波数誤差を圧縮する回路である。

Job Item

AFC回路は周波数誤差を検出し、フィードバック制御系を構成して発振器の周波数を自動制御し、搬送波周波数に追従させて周波数誤差を抑圧させるものである。
PSK方式のAFCの場合、受信信号の搬送波周波数と受信器の局部発振器の発振周波数を比較する必要があり、二つの入力信号に対する弁別回路としてクロスプロダクト形周波数弁別器を用いる。

回路構成としては、
・受信信号とフィードバック信号を乗算する為のDBM
・DBM通過後に中間周波数を抽出する為のバンドパスフィルタ
・PSK方式の誤差情報抽出の為のクロスプロダクト形周波数弁別器
・周波数弁別器通過後の信号エイリアス除去の為のローパスフィルタ
・誤差情報を元にフィードバック信号を送信するVCO

DETAILED DESIGN LIST

| ID | 0000 |
|---|---|
| User Name | user |
| Product Name | car audio design |
| Login Time | 2003/05/07 20:19:59 |

Development-02 — Select task — 10/11

| № | | Status | Development Version | Unit | Component | Design Item | Recorded Time | Preparer | Completion Date |
|---|---|---|---|---|---|---|---|---|---|
| 1 | ⊙ | design completion (or design OK) | development-02 | body | component 1 | design item 1-1-1 | 00:00:00 | user | 2003/05/07 20:33:42 |
| 2 | ○ | design completion (or design OK) | development-02 | body | component 1 | design item 1-1-2 | 00:06:00 | user | 2003/05/07 20:39:42 |
| 3 | ○ | designable (or design OK) | development-02 | body | component 1 | design item 1-2-1 | 00:00:00 | user | |
| 4 | ○ | designable (or design OK) | development-02 | body | component 1 | design item 1-1-3 | 00:00:00 | user | |
| 5 | ⊙ | undesignable (or design NG) | development-02 | body | component 1 | design item 1-2-2 | 00:00:00 | | |
| 6 | ⊙ | undesignable (or design NG) | development-02 | body | component 1 | design item 1-3-1 | 00:00:00 | | |
| 7 | ○ | undesignable (or design NG) | development-02 | body | component 2 | design item 2-1-1 | 00:00:00 | | |
| 8 | ○ | undesignable (or design NG) | development-02 | body | component 2 | design item 2-2-1 | 00:00:00 | | |
| 9 | ⊙ | undesignable (or design NG) | development-02 | body | component 2 | design item 2-1-2 | 00:00:00 | | |
| 10 | ⊙ | undesignable (or design NG) | development-02 | body | component 2 | design item 2-2-2 | 00:00:00 | | |
| Extraction | all items | all items | all items | all items | all items | all items | | all items | Next |

Detailed design    Flow View    Re-Load

RETURN

FIG.29

DESIGN PROCESS LIST WINDOW

| Component Name | Component Position Name | Design Item Name | Status | Design Engineer | Date |
|---|---|---|---|---|---|
| component 1 | component position 1-1 | design item 1-1-1 | design completion | unknown | 2002/08/01 11:16:28 |
| | | design item 1-1-2 | design completion | unknown | 2002/08/01 11:16:46 |
| | | design item 1-1-1 | designable (or design OK) | unknown | 2002/08/01 11:18:16 |
| component 2 | component position 2-1 | design item 2-1-1 | design completion | unknown | 2002/08/01 11:16:53 |
| | component position 2-2 | design item 2-2-1 | design completion | unknown | 2002/08/01 11:17:00 |
| | | design item 2-2-2 | design completion | unknown | 2002/08/01 11:18:16 |
| component 3 | component position 3-1 | design item 3-1-1 | design completion | unknown | 2002/08/01 11:17:09 |
| component 4 | component position 4-1 | design item 4-1-1 | design completion | unknown | 2002/08/01 11:17:29 |
| | component position 4-2 | design item 4-2-1 | designable (or design OK) | unknown | 2002/08/01 11:17:09 |
| component 5 | component position 5-1 | design item 5-1-1 | designable (or design OK) | unknown | 2002/08/01 11:17:09 |
| component 6 | component position 6-1 | design item 6-1-1 | designable (or design OK) | unknown | 2002/08/01 11:17:09 |
| | | design item 6-1-2 | undesignable (or design NG) | unknown | 2002/08/01 11:12:28 |
| component 7 | component position 7-1 | design item 7-1-1 | undesignable (or design NG) | unknown | |
| | component position 7-2 | design item 7-2-1 | undesignable (or design NG) | unknown | |
| component 8 | component position 8-1 | design item 8-1-1 | undesignable (or design NG) | unknown | |

Unit Selection: display all

Component Selection: display all

[Information Display] [Design Flow Display] [End Declaration] [Return]

FIG.30
(A)
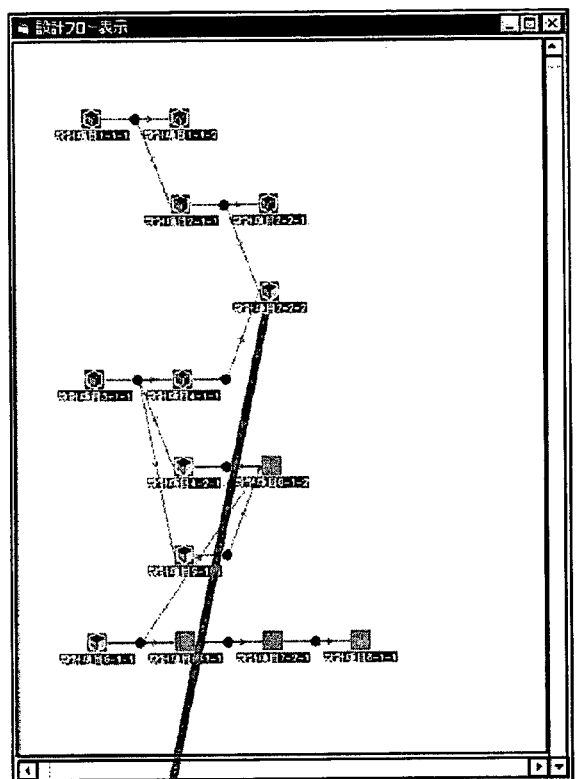
(B)
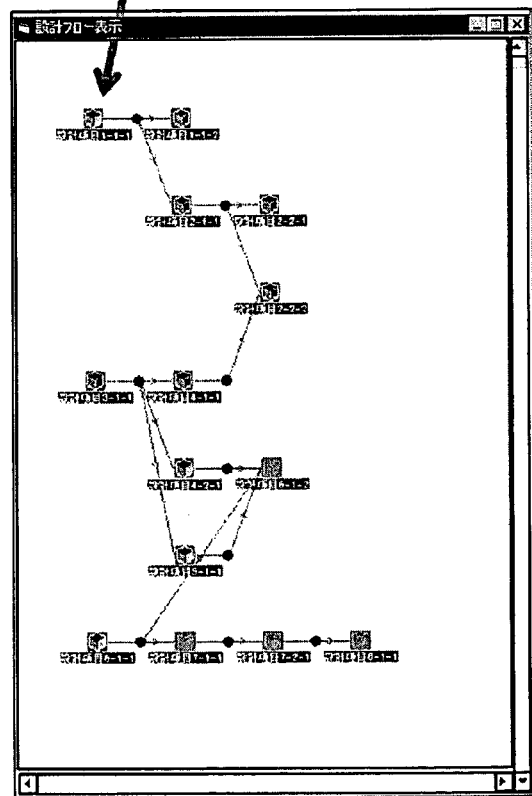

FIG. 31A

DETAILED DESIGN LIST

| ID | ○○○○ |
|---|---|
| User Name | user |
| Product Name | circuit design |
| Login Time | 2003/05/07 13:27:48 |

─Development-02──────────────────────  Select task

| No | Status | Development Version | Unit | Component | Design Item | Recorded Time | Preparer | Completion Date |
|---|---|---|---|---|---|---|---|---|
| 1 | design completion | development-02 | body | component 1 | design item 1-1-1 | 00:00:00 | user | 2003/05/07 20:33:42 |
| 2 | design completion | development-02 | body | component 1 | design item 1-1-2 | 00:00:00 | user | 2003/05/07 20:39:42 |
| 3 | design completion | development-02 | body | component 1 | design item 1-2-1 | 00:00:00 | user | 2003/05/07 20:41:08 |
| 4 | design completion | development-02 | body | component 1 | design item 1-1-3 | 00:00:00 | user | 2003/05/07 20:42:18 |
| 5 | design completion | development-02 | body | component 1 | design item 1-2-2 | 00:00:00 | user | 2003/05/07 20:50:01 |
| 6 | design completion | development-02 | body | component 2 | design item 2-1-1 | 00:00:00 | user | 2003/05/07 20:41:28 |
| 7 | design completion | development-02 | body | component 2 | design item 2-2-1 | 00:00:00 | user | 2003/05/07 20:41:36 |
| 8 | design completion | development-02 | body | component 2 | design item 2-1-2 | 00:00:00 | user | 2003/05/07 20:42:30 |
| 9 | design completion | development-02 | body | component 2 | design item 2-2-2 | 00:00:00 | user | 2003/05/07 20:50:09 |
| 10 | design completion | development-02 | body | component 3 | design item 3-1-1 | 00:00:00 | user | 2003/05/07 20:41:55 |

10/10

Extraction [all items ▼] [all items ▼] [all items ▼] [all items ▼] [all items ▼]  Detailed design  Flow View  Re-Load  End Declaration

↩RETURN

METHOD AND SYSTEM FOR SUPPORTING CIRCUIT DESIGN FOR PRODUCTS

BACKGROUND OF THE INVENTION

1. Field of Invention

The present invention relates to a design support method and system for guiding or navigating a design engineer who performs the design of a specific version of a product, in various manners, such as by presenting job content to be executed by the design engineer.

2. Description of the Related Art

Heretofore, in the process of designing a circuit of a certain product, various parameters of the circuit, such as required circuit components and the positional relationship between the circuit components, have been determined on a trial-and-error basis. Therefore, one design engineer can acquire techniques for designing within a short period of time while maintaining a standard or higher level of design quality only after the design engineer designs circuits of a product family belonging to the same category over and over again. While such repeated experience in circuit design of a product family belonging to the same category allows design engineers to familiarize themselves with the circuit design of the product family and acquire design knowhow individually, the knowhow is generally accumulated only in the individual design engineer, and hardly shared between other design engineers.

From this point of view, there has been known a technique of retrieving database accumulating previous design specifications of products belonging to the same category, and using them as reference information for selecting components of a new product under design, as disclosed in Japanese Patent Publication No. 3288686 titled "Design Support Apparatus and Design Support Program".

While this technique allows the design specifications obtained by retrieving database to be used as reference information for selecting components of a new product under design, it has been difficult to navigate design engineers with respect to design specifications and/or design items, which are to be considered in an actual design process.

SUMMARY OF THE INVENTION

Under a situation where the demands of product purchasers become diversified, and a large-item small-scale production is generalized, it is required to continuously bring various versions of one product to the market within a short period of time even if the product versions fall into the same category, which leads to a strong need for drastically reducing the period required for designing each of the versions. Thus, in the field of circuit design for various products, it becomes critical to allow even inexperienced design engineers to design various versions at a standard or higher quality level within a short period of time.

For this purpose, there is a strong need for navigating design engineers with respect to all of circuit components, design specifications and design items, which are to be considered in circuit design of a product.

It is therefore an object of the present invention to provide a technology meeting the above need.

In order to achieve the above object and other object, according to a first aspect of the present invention, there is provided a method for supporting a design engineer who performs the circuit design of a given product, by means of a computer. This method comprises: a setup step of registering in a database information about design specifications, circuit components, design items, the correlations between the design specifications and the circuit components, and the correlations between the design items and the design specifications or between the design items and the circuit components, which are required for the circuit design of the product, while giving given definitions to the information on a computer; a design-specification determination step of using a computer to prompt the design engineer to determine the content of the design specifications with respect to a specific version of the product; a circuit-component determination step of extracting circuit components for the specific version from the database in accordance with the design specification-circuit component correlations registered in the setup step, and presenting the extracted circuit components to the design engineer on a computer so as to prompt the design engineer to determine circuit components required for the specific version while performing addition, alteration and/or deletion on circuit components if required; a design-item extraction step of using a computer to extract design items required for the specific version in accordance with the design item-design specification correlations or the design item-circuit component correlations registered in the setup step, and present the extracted design items to the design engineer; and a design-item execution step of using a computer to present to the design engineer specific job content of each of the design items extracted in the design-item extraction step, and navigate and prompt the design engineer to execute the job content.

According to the above method, even design engineers inexperienced in circuit design of the product, such as an design engineer who knows little about what kind of jobs should be executed in what procedure, can execute jobs in line with the job content navigated by the method, so as to achieve a standard or higher level of design quality while reducing a period required for the circuit design.

In one preferred embodiment of the present invention, the setup step includes determining the temporal order relationship between the design items. In this case, a design flow diagram for the design items extracted in the design-item extraction step is created on a computer in accordance with the predetermined order relationship between the extracted design items, and presented to the design engineer.

According to this embodiment, the design engineer can readily figure out the entire design job flow.

In another preferred embodiment of the present invention, the setup step includes setting up the correlation between each of the design items and a document related thereto, and registering information about the correlation in the database, and the design-item execution step includes extracting the content of the document related to the design item subject to a specific job to be executed by the design engineer, if any, in accordance with the document-design item correlation, and presenting the content of the document to the design engineer.

According to this embodiment, even if the engineer is inexperienced in circuit design, he/she can refer to related documents registered by skilled engineers in each stage of the design, so as to share important design knowhow with the skilled engineers.

In another preferred embodiment of the present invention, the above document is a patent publication.

According to this embodiment, the design engineer can execute design jobs under the recognition of competitor's patents to prevent patent infringements likely to cause the redo of the entire design or the abandon of production, for example, immediately before distribution of the product.

In another preferred embodiment of the present invention, the setup step includes registering respective costs of the circuit components in a database. In this case, every time one of the circuit component required for the specific version is determined in the circuit-component determination step, the cost of the determined circuit component is read out from the database, and a cumulative cost of the previously determined circuit components is calculated to present the cumulative cost to the design engineer.

According to this embodiment, the design engineer can execute design jobs under the recognition of a current cumulative cost to adequately determine each of the costs of the circuit components while taking account of a target total cost. This makes it possible to avoid an ambagious process such that the total cost is checked after the completion of the design, and the design is redone if significant cost overrun is found.

In another preferred embodiment of the present invention, the method further includes a step of allowing any one of the design items which has been completed in the design-item execution step to be returned to its uncompleted status while keeping obtained data on the design item, so as to re-execute the design item.

According to this embodiment, even if it is required to redo a part of design jobs, only a minimum number of design items can be re-designed without bringing the results of completed design jobs to naught.

According to a second aspect of the present invention, there is provided a system for supporting a design engineer who performs the circuit design of a given product, the system comprises: setup means for registering in a database information about design specifications, circuit components, design items, the correlations between the design specifications and the circuit components, and the correlations between the design items and the design specifications or between the design items and the circuit components, which are required for the circuit design of the product, while giving given definitions to the information; design-specification determination means for prompting the design engineer to determine the content of the design specifications with respect to a specific version of the product; circuit-component determination means for extracting circuit components for the specific version from the database in accordance with the design specification-circuit component correlations registered by the setup means, and presenting the extracted circuit components to the design engineer so as to prompt the design engineer to determine circuit components required for the specific version while performing addition, alteration and/or deletion on circuit components if required; design-item extraction means for extracting design items required for the specific version in accordance with the design item-design specification correlations or the design item-circuit component correlations registered by the setup means, and presenting the extracted design items to the design engineer; and design-item execution means for presenting to the design engineer specific job content of each of the design items extracted by the design-item extraction means, and navigating and prompting the design engineer to execute the job content.

According to the above system, even design engineers inexperienced in circuit design of the product, such as an design engineer who knows little about what kind of jobs should be executed in what procedure, can execute jobs in line with the job content navigated by the system, so as to achieve a standard or higher level of design quality while reducing a period required for the circuit design.

In another preferred embodiment of the present invention, the setup means is operable to define the parent-children relationship between the design items. In this case, the system includes means for creating a design flow diagram of the design items extracted by the design-item extraction means, in accordance with the predetermined parent-children relationship between the extracted design items, and presenting the design flow diagram to the design engineer.

According to this embodiment, the design engineer can readily figure out the entire design job flow.

In another preferred embodiment of the present invention, the setup means is operable to set up the correlation between each of the design items and a document related thereto, and registering information about the correlation in the database. In this case, the system includes means for extracting the content of the document correlated with the design item subject to a specific job to be executed by the design engineer, if any, and presenting the content of the document to the design engineer.

According to this embodiment, even if the engineer is inexperienced in circuit design, he/she can refer to related documents registered by skilled engineers in each stage of the design, so as to share important design knowhow with the skilled engineers.

In another preferred embodiment of the present invention, the above document is a patent publication.

According to this embodiment, the design engineer can execute design jobs under the recognition of competitor's patents to prevent patent infringements likely to cause the redo of the entire design or the abandon of production, for example, immediately before distribution of the product.

In another preferred embodiment of the present invention, the setup means includes means for registering respective costs of the circuit components in a database. In this case, the system includes means for, every time one of the circuit components required for the specific version is determined by the circuit-component determination means, reading out the cost of the determined circuit component from the database, calculating a cumulative cost of the previously determined circuit components, and presenting the cumulative cost to the design engineer.

According to this embodiment, the design engineer can execute design jobs under the recognition of a current cumulative cost to adequately determine each of the costs of the circuit components while taking account of a target total cost. This makes it possible to avoid an ambagious process such that the total cost is checked after the completion of the design, and the design is redone if significant cost overrun is found.

In another preferred embodiment of the present invention, the design-item execution means includes means for allowing any one of the design items which has been completed to be returned to its uncompleted status while keeping obtained data on the design item, so as to re-execute the design item.

According to this embodiment, even if it is required to redo a part of design jobs, only a minimum number of design items can be re-designed without bringing the results of completed design jobs to naught.

As used in this specification, the term "design specifications" means general performance requirements, such as receive signal: QPSK, circuit board size: 1000 mm×1000 mm, or drive voltage: 15V The term "circuit components" means items to be determined with respect to each of circuit component, such as a circuit component name, or (1) material, (3) basis of selection, (4) position or (5) wiring to other component of one circuit component.

That is, these two have a relationship that specific specifications are achieved by combining circuit components.

Further, the term "design items" means subdivided items to be designed, in the relatively minute level, such as design of a signal modulation section.

BRIEF DESCRIPTION OF THE DRAWINGS

[FIG. 7]
A dialog box displaying all of the registered specifications and circuit components, according to one embodiment of the present invention.

[FIG. 15]
A dialog box showing all of circuit components registered in a system according to one embodiment of the present invention.

[FIG. 21]
The dialog box in FIG. 20 displaying design items to be designed for a "development-02" in detailed design.

[FIG. 23]
An image to be displayed in response to clicking on a document titled "design sheet included in a "Knowledge List" box in FIG. 22.

[FIG. 25]
A dialog box to be displayed when one design item goes into its "design completion" state, according to one embodiment of the present invention.

[FIG. 29]
A new Design Process List Window in case of redoing the design of the design item 1-1-1, according to one embodiment of the present invention.

[FIG. 30]
A diagram showing the change in design flow between before and after the execution of a return function, according to one embodiment of the present invention.

A dialog box for declaring the completion of the detailed design, according to one embodiment of the present invention.

Figure 31B:
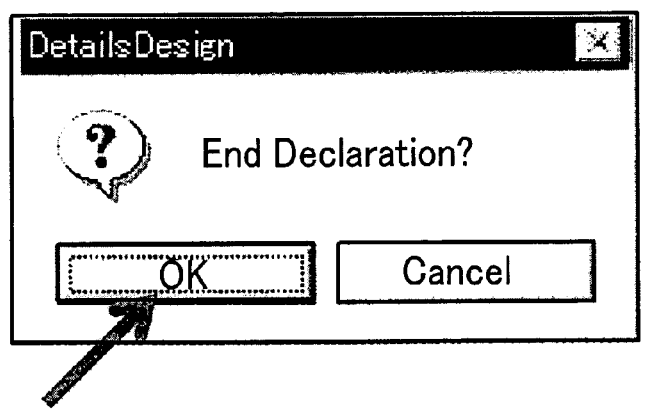
[FIG. 31(b)]
Figure 31C:
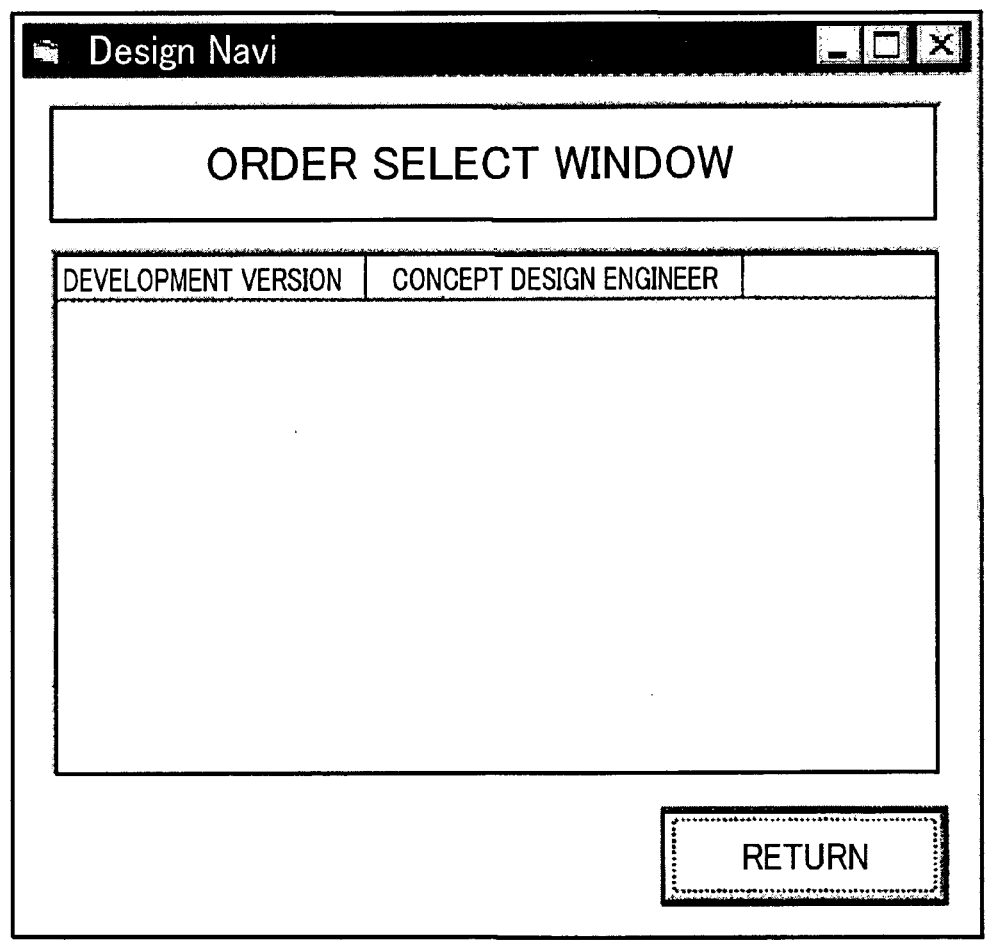
[FIG. 31(a)]
A dialog box for declaring the completion of the detailed design, according to one embodiment of the present invention.

[FIG. 31(c)]

A dialog box for declaring the completion of the detailed design, according to one embodiment of the present invention.

PREFERRED EMBODIMENT OF THE INVENTION

With reference to the drawings, a design navigation system achieved as one embodiment of the present invention. The design navigation system according to this embodiment fundamentally comprises a computer, and a computer program executable on the computer.

The design navigation system according to this embodiment generally includes two operational modes: "setup mode" and "execution mode".

The "setup mode" is a function of registering various information about a certain product, such as a portable phone, to a database while correlating with each other on a computer. For example, this information includes: design specifications required for designing transmit/receive signals, the positional relationship between components and a product supposed to be used, power consumption in each section, etc.; circuit components supposed to be used; and design items supposed to involve design jobs. In other words, the "setup mode" means a mode for preparing information required for navigating design jobs of a design engineer, in advance of the execution of the design jobs.

The "execution mode" means a mode for navigating actual design jobs of a design engineer who designs a circuit of a specific version of a certain product (e.g. one version of a portable phone as a product), for example, on a CAD system. In view of the content of design jobs, the execution mode is divided into "concept design" and "detailed design".

In the "concept design", design items required for designing the version are extracted, and then a design flow indicating a sequence or order of executing the extracted design items to determine their content is created.

In the "detailed design", according to the design flow created from the concept design, each of the design items to be designed is presented to a detailed design engineer from time to time so as to prompt the detailed design engineer to execute required design jobs involved in the presented design item.

It is understood that the above classification divided into the "concept design" and the "detailed design" is no more than one example, and the present invention is not limited to such a classification. For example, the execution mode may be configured as one series of procedure or may be divided into three or more sub-modes.

Figure 1:
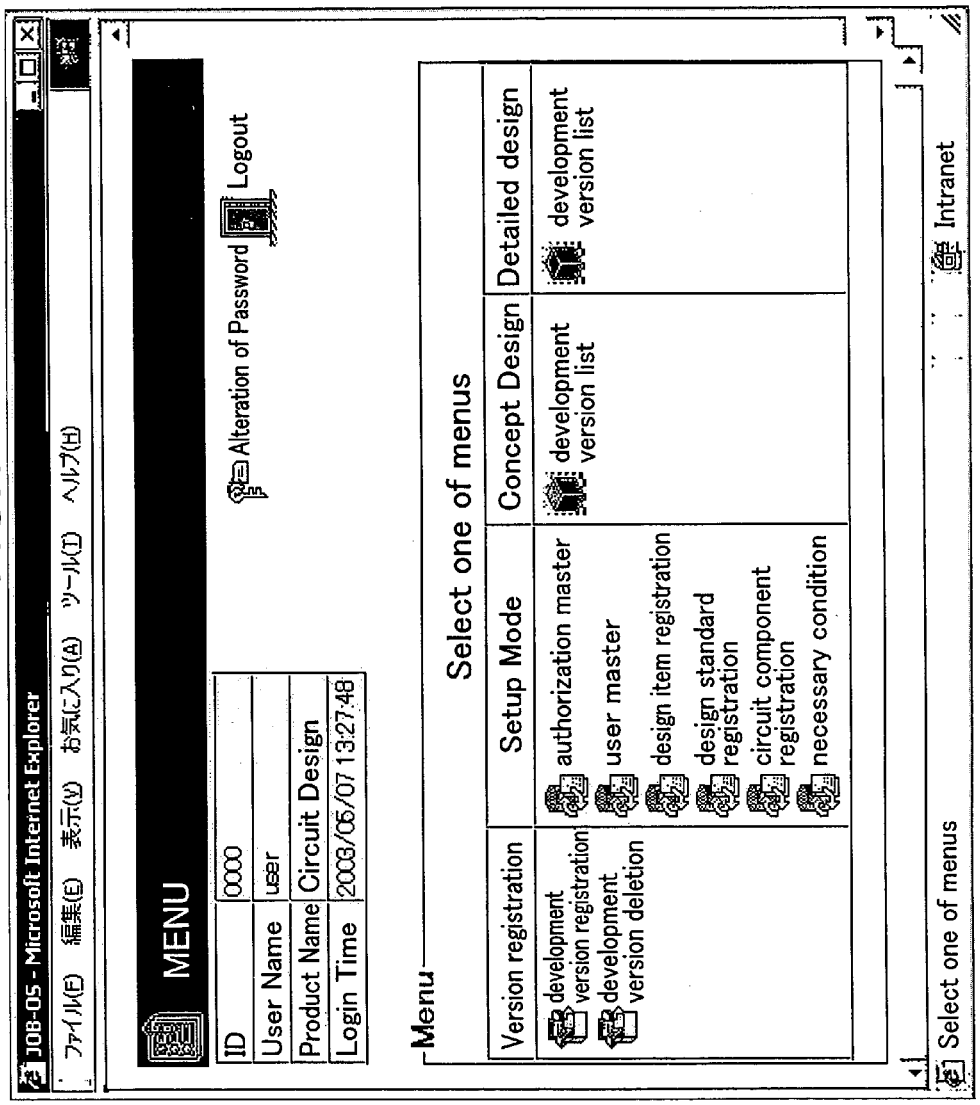
[FIG. 1]
A dialog box displaying select buttons including a "Setup Mode" button, "Concept Design" button and "Detailed Design" button, according to one embodiment of the present invention.

Upon activation of the design navigation system according to this embodiment, a login window (not shown) is first displayed on a display screen. When an authorized user or operator enters his/her name and password through the login window and then clicks on an "OK" button of the login window, a dialog box as shown in FIG. 1 is displayed. This dialog box is configured to display a plurality of select buttons associated with the above "setup mode", "concept design" and "detailed design", and allow an operator to click on any of the select buttons so as to select any of the modes. The following description on the design navigation system according to this embodiment will be made in conjunction with the "setup mode", "concept design" and "detailed design" in this order.

[Setup Mode]

Figure 2:
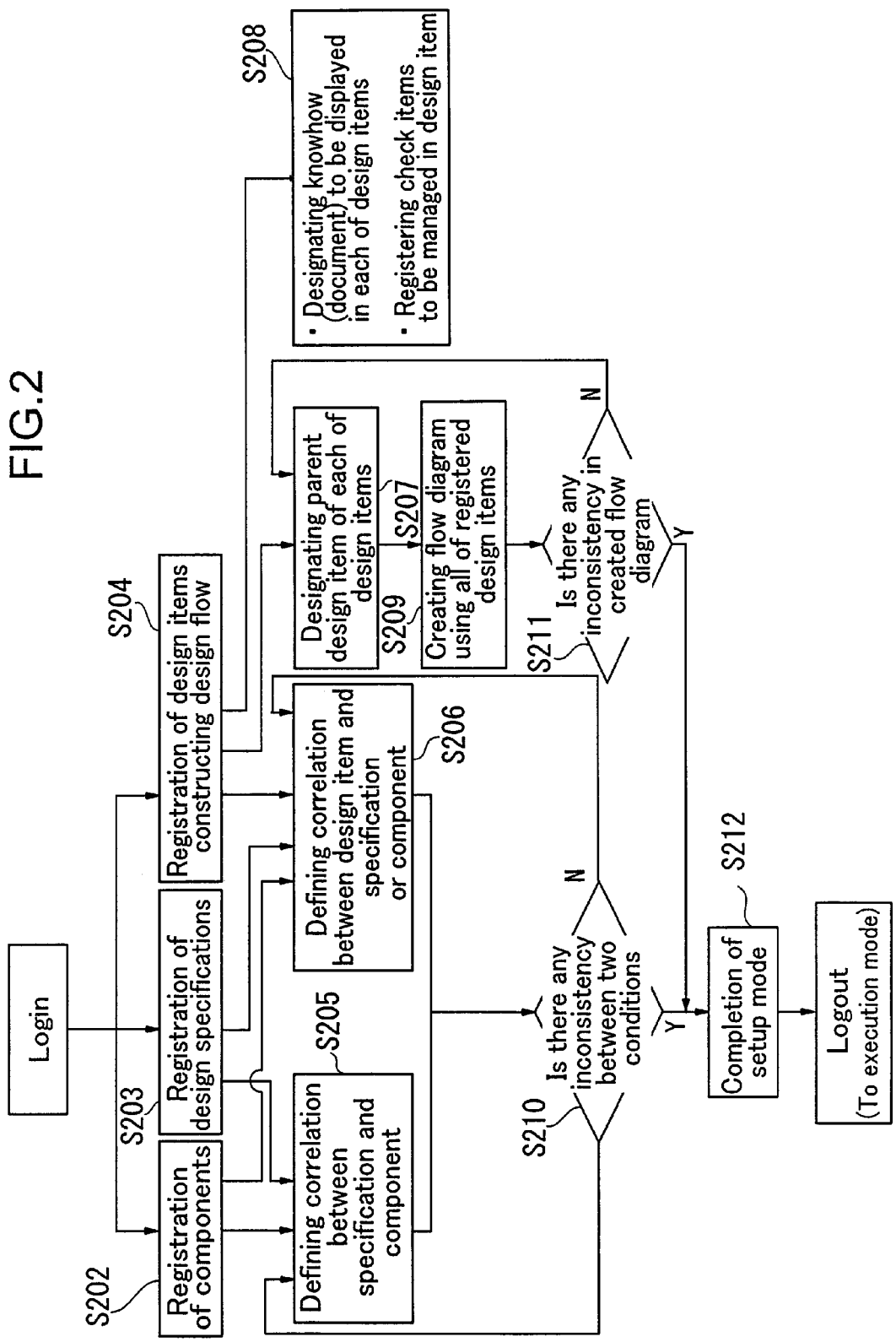
[FIG. 2]
A flowchart showing the entire process of an operation in a setup mode, according to one embodiment of the present invention.

As described above, in the setup mode, the information required for navigating design jobs of a design engineer primarily in the concept design and the detailed design are prepared on a computer in advance of the execution of the design jobs, and registered in a database. FIG. 2 is a flowchart showing the entire procedure of the setup mode.

The following description shows one case where this setup mode is used to establish a database to be utilized in a system for supporting an operator who performs the design of a portable phone. Even if plural versions of a product are categorized as portable phones, all of the versions will be obviously different in design content. However, as long as the product versions fall into the same category of portable phones, they have a lot in common in terms of design content. From this point of view, fundamental information about the design of portable phones will be registered in the setup mode. The registered information can be used to navigate design engineers who design individual versions of a portable hone.

A box titled "Setup Mode" on the dialog box in FIG. 1 displays six options: "authorization master", "user master", "design item registration", "design standard registration", "circuit component registration", and "necessary condition". The operator selectively clicks on one of the options, which relates to an intended operation. In this box, the "design item registration" corresponds to an operation of "registration of design items constructing design flow" (see S204) in flowchart of FIG. 2. The "design standard registration" corresponds to an operation of "registration of design specifications" (see S203) in FIG. 2. The "component registration" corresponds to an operation of "registration of components to be used as circuit components" (see S202) in FIG. 2.

Figure 3:
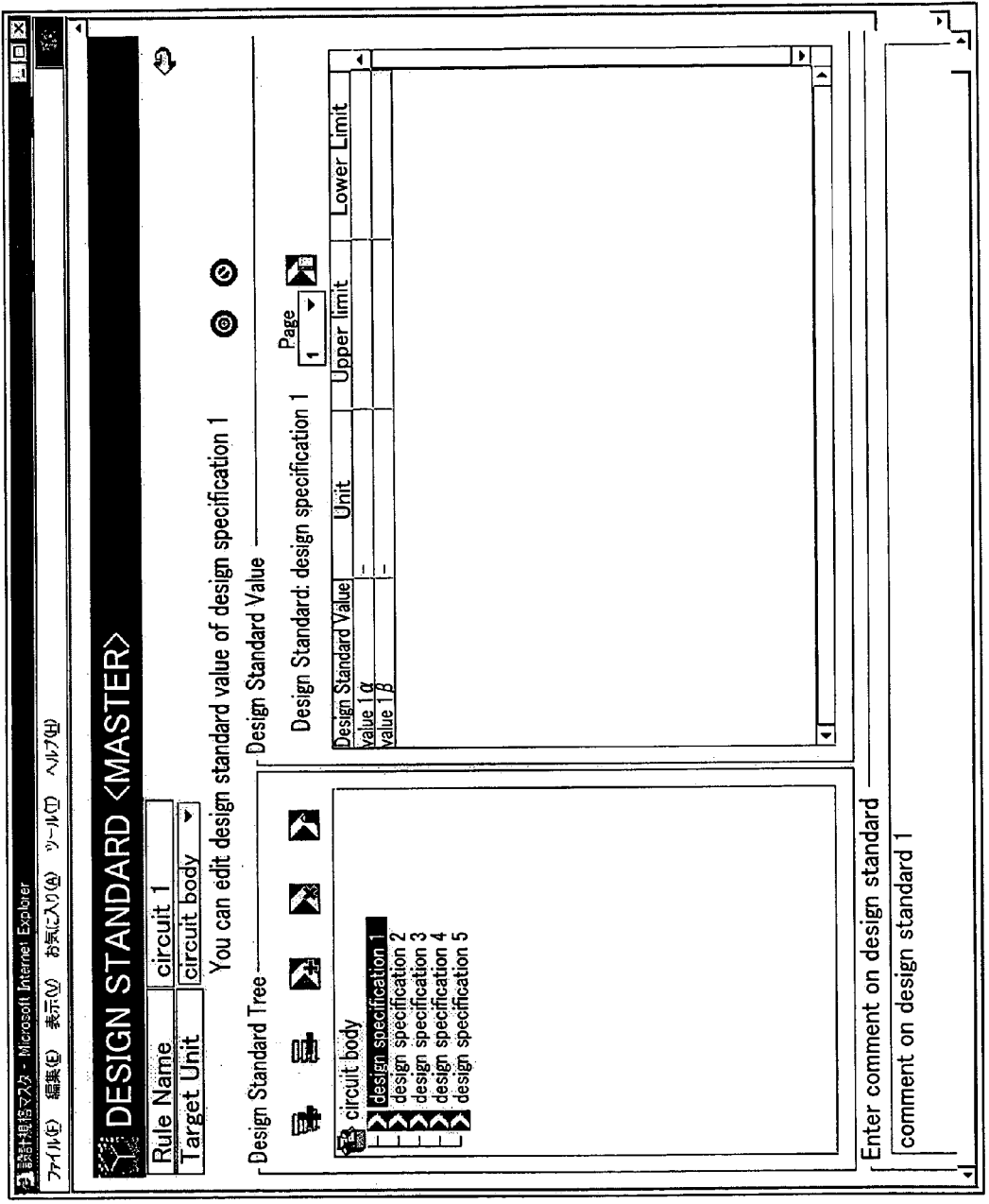
[FIG. 3]
A dialog box for registering design items, according to one embodiment of the present invention.

The "design standard registration" (see S203) will be first described below. When the operator clicks on the "design standard registration" of the dialog box illustrated in FIG. 1, a window as shown in FIG. 3 is displayed. This window is a dialog box for registering design standards or design specifications. While design standard names, such as "design specification 1", have already been registered in the box titled "Design Standard Tree" in FIG. 3, such design standard names had not been registered when the system was initially started up. A design standard name can be registered by clicking on the "Design Standard Tree" box with the right mouse button, clicking on an "Addition" button (not shown) among resulting displayed option buttons, entering an adequate name into a resulting displayed input box for design standard name, and pushing the return key. Through this operation, the entered name will be immediately added in the tail of the "Design Standard Tree" box.

The added design standard name can be registered in correlation with a "design standard value" on the right side of the "Design Standard Tree" box. In this case, if the system is configured such that a design engineer selects suitable one of optional design standard values during design, a plurality of design standard values will be entered and registered to provide the options.

In the example illustrated in FIG. 3, two values: "value 1α" and "value 1β", are registered as options for the design standard name "design standard 1" (a specific example of the "value 1α" or "value 1β" may include "drive voltage=10 V" or "modulation signal=QPSK"). Further, any information about this "design standard" can be written as a comment in a bottom box titled "Enter comment on design standard". The comment written in the "Enter comment on design information" box will be used as valuable information capable of being readily referred by a design engineer during the detailed design. In this manner, required design specifications are sequentially registered in the "Design Standard Tree" box. In conjunction with the registration of the design specifications, one or more design standard values are also registered for each of the design specifications.

Figure 4:
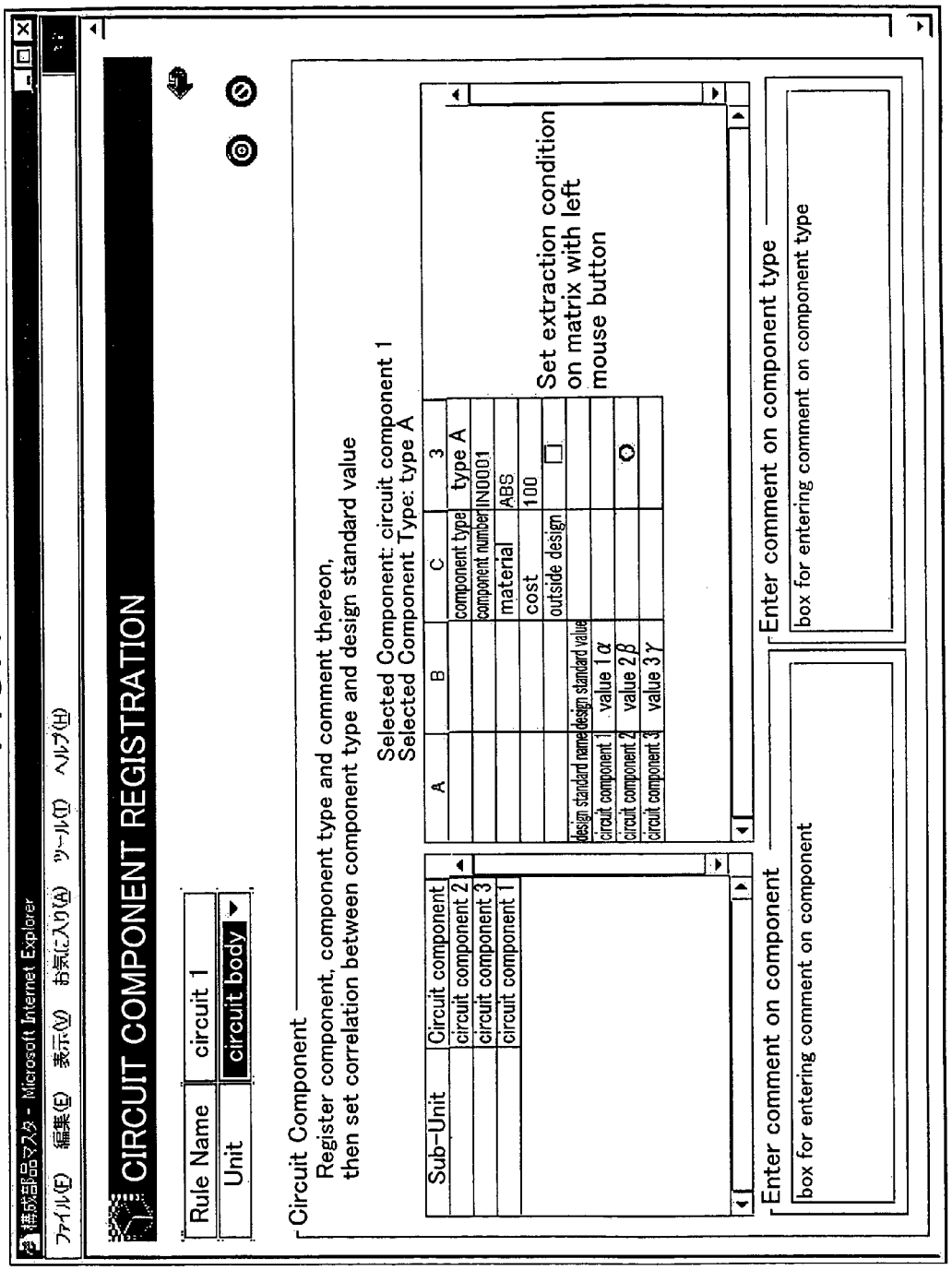
[FIG. 4]
A dialog box for registering circuit components supposed to be used in design jobs, according to one embodiment of the present invention.

The "component registration" (see S202) will be described below. When the operator clicks on the "Component Registration" button of the dialog box in FIG. 1, a window as shown in FIG. 4 is displayed. This window is a dialog box for registering circuit components supposed to be used in design jobs. As with the "Design Standard Tree" box in FIG. 3, no component is initially registered in a box titled "Circuit Component" in FIG. 4. A circuit component can be registered by clicking on the "Circuit Component" box with the right mouse button, clicking on an "Addition" button (not shown) among resulting displayed options, entering an adequate name into a resulting displayed input box for circuit component name, and pushing the return key. Through this operation, the entered name will be immediately added in the tail of the "Circuit Component" box. Thus, circuit components can be registered in a simple operation.

Then, information about the entered circuit components is registered using a box on the right side of the "Circuit Component" box. The following description will be made in conjunction with one example where information about one specific circuit component or "circuit component 1" is registered. In this example, given that there is the need for preparing a type of "circuit component type A". Thus, a field displayed as "circuit component type name=type A" is provided in the 3rd column of the right box.

In addition, four fields titled "component type", "component number", "material", "cost" and "outside design" are provided in a columns C. In this case, "type A", "IN0001", "ABS", "100" and "☐ (check box)", respectively, corresponding to these attributes are entered in the 3rd column.

The above "outside design" means outsourcing design. If the "outside design" check box is marked, the circuit component will be registered, but no actual design will be executed.

If information about respective costs of circuit components is registered through the "cost" field, the costs of circuit component the use of which are determined in an after-mentioned concept design can be accumulated so as to present a cumulative total cost to an operator.

These fields are configured such that an operator executing the setup mode can arbitrarily define them. Thus, the operator can enter required values or characters into these preset fields.

As for the circuit components, it is required to define the correlation with the design specifications. Three design standard names: "design specification 1", "design specification 2" and "design specification 3", supposed to be applied to the "circuit component 1" are set up in a column A titled "design standard name", and three design standard values: "value 1α", "value 2β" and "value 3γ", respectively, corresponding to the above attributes are set up a column B titled "design standard value" (as described above, a specific example of the "value 1α", "value 2β" or "value 3γ" may include "drive voltage=10 V" or "modulation signal=QPSK"). When the operator clicks on desired one cell in this matrix with the right mouse button, and then selects a resulting displayed button "Set as extraction condition", a mark "○" is displayed on the clicked cell.

In the dialog box illustrated in FIG. 4, the value "2 beta" of "the design specification 2" indicated by the mark "○" on "the 3rd column" will be a specification correlated with the "circuit component 1". That is, the design specification defined as the "value 2 beta" of "the design specification 2" is correlated with the circuit component defined as the "type A" of the "circuit component 1".

In this manner, the correlation between a circuit component and a design specification associated with the circuit component can be readily defined, and this defined correlation will be effectively used in the subsequent execution mode (concept design and detailed design). For example, if an operator selects the "value 2β" for the "design specification 1" in the detailed design (see S1205 in FIG. 11), the "type A" of the "circuit component 1" will be extracted as a component corresponding to the "value 2β" (see S1206). In this manner, a circuit component corresponding to a designated design specification is automatically extracted. Thus, even an operator inexperienced in design can select a required and adequate circuit component.

Figure 5A:
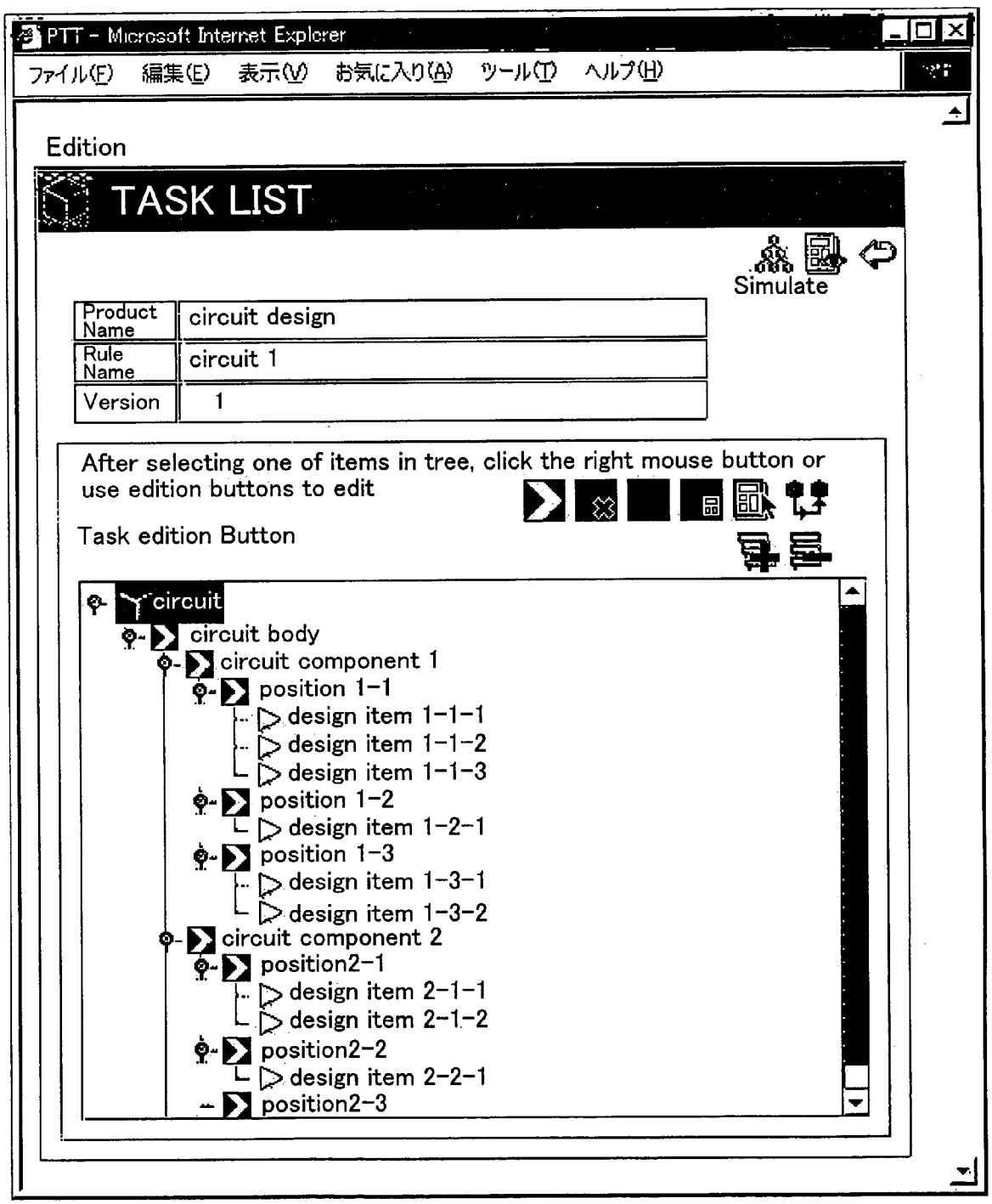
[FIG. 5A]
A dialog box for entering/editing properties concerning the registration of a design item itself, according to one embodiment of the present invention.
Figure 5B:
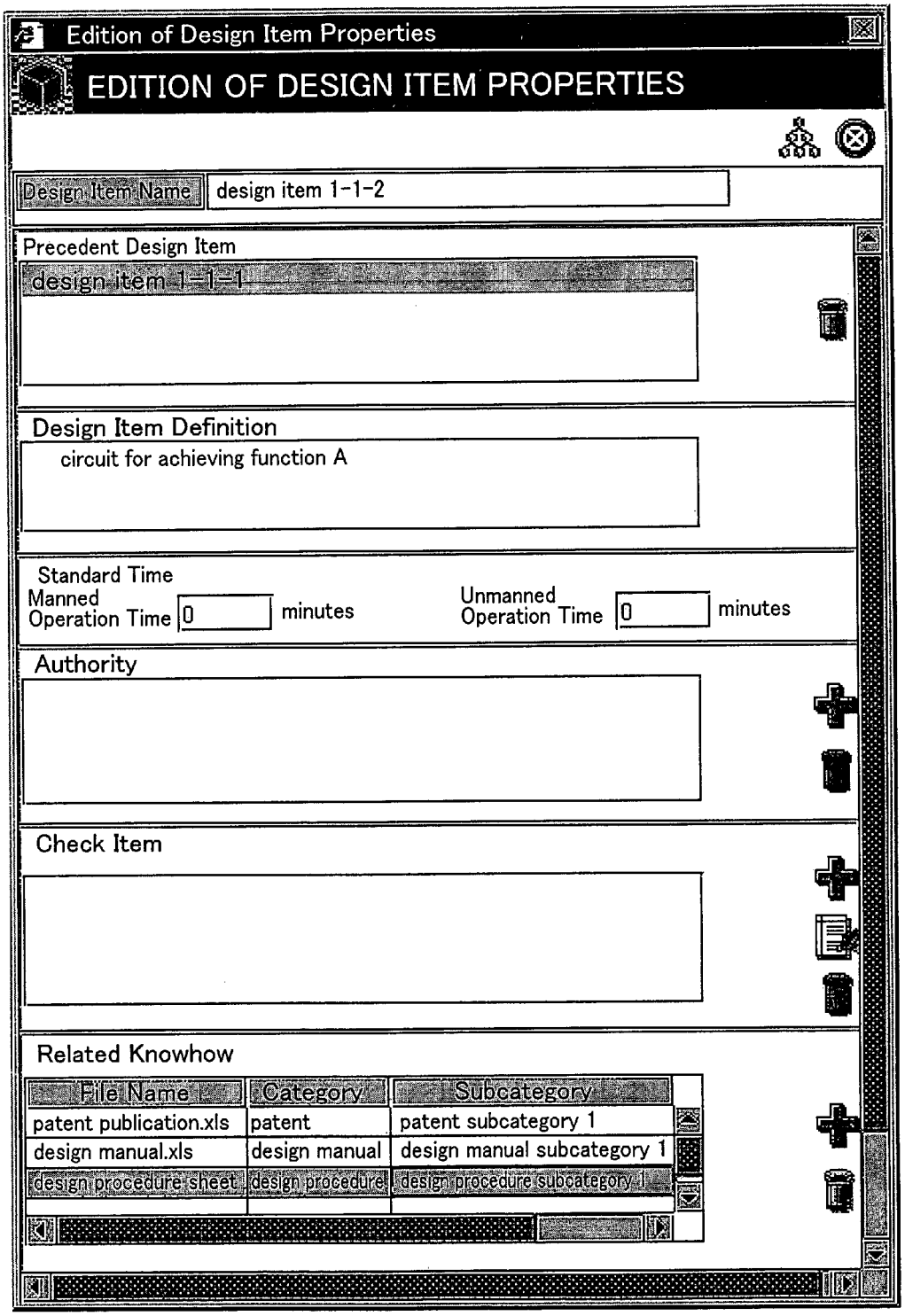
[FIG. 5B]
A dialog box for entering/editing/registering properties of a specific design item, according to one embodiment of the present invention.

The "design item registration" (see S204) will be described below. When the operator clicks on the "Design Item Registration" button of the dialog box in FIG. 1, two windows as shown in FIG. 5A (left-half of the screen) and FIG. 5B (right-half of the screen) are displayed (S204). These windows are dialog boxes for registering a design item itself (FIG. 5A), and entering, editing and registering properties of a specific design item, for example "design item 1-1-2" in FIG. 5B displayed on the right side of FIG. 5A. The example in FIGS. 5A and 5*b* show dialog boxes in a stage where a certain number of design items have already been registered. In a stage where the setup mode is initially started up, only a lower level just next to "Body" in a tree structure of FIG. 5A, or "circuit component 1" and the like, has been registered, but further lower levels, or "component position 1-1", "design item 1-1-1" and the like, have not been registered. In this case, the operator can register the "component position" and "design item" one by one according to a given procedure.

The term "component position" herein means a position of a certain circuit where a specific circuit component is to be located, for example "signal modulation position", "filter position" or "signal amplification position" in a signal moderation circuit.

The dialog box in FIG. 5B is configured such that a design item and other items (standard time required for executing the design item, related patent publication, etc.). When a new design item is registered, it is displayed at a given position in this tree. While an operator can freely determine the depth of the tree hierarchy in consideration of operationality in the setup mode, the system according to this embodiment is managed under a rule that the lowest level must be a design item. For designating a registered item as a design item, an operator will specify this intention separately. For example, after newly registering a "design item 1-1-2" at the lowest level of the tree, if an operator intends to designate it as a design item, he/she will enter information about the design item through entering/editing boxes on the dialog box illustrated in FIG. 5B.

On uppermost portion of the dialog box in FIG. 5A, a box titled "Design Item Name" indicates that this dialog box relates to "design item 1-1-2" or target design item. On the underside of the "Design Item Name" box, boxes titled "Precedent Design Item", "Design Item Definition", "Standard Time", "Authority", "Check Item" and "Related Knowhow" are provided.

The "Precedent Design item" box is provided for defining a parent item or a design item which must have been completed to enable the determination on the target design item to be executed. When "design item 1-1-1" in FIG. 5A is defined as a parent item, the operator can drag and drop the "design item 1-1-1" to the "Precedent Design item" box in FIG. 5B. Through this operation, the "design item 1-1-1" is displayed on the "Precedent Design item" box, and defined as a parent item of the "design item 1-1-2".

The number of design items to be designated as a parent item is not always one because there is a possibility that a design job on a certain design item can be initiated only after the completion of a plurality of other design items. After the parent information is fully set up for each of the design items, the operator can click on a "Simulation" button in FIG. 5A or 5B to automatically check whether the registered content includes logical inconsistency. This operation is performed by executing a simulation program pre-installed in the computer.

The "Design Item Definition" box in FIG. 5B is used to enter definitions or supplementary explanations on the target design item.

The "Standard Time" box is used to register a standard or normal time between the initiation and completion of the target design item.

The "Authority" box is used to define the authority to acquire the target design item.

The "Check Item" box is used to register check items concerning the target design item.

The "Related Knowhow" is used to register knowhow, such as information about previous concerns or patents, related to the target design item.

Figure 6:
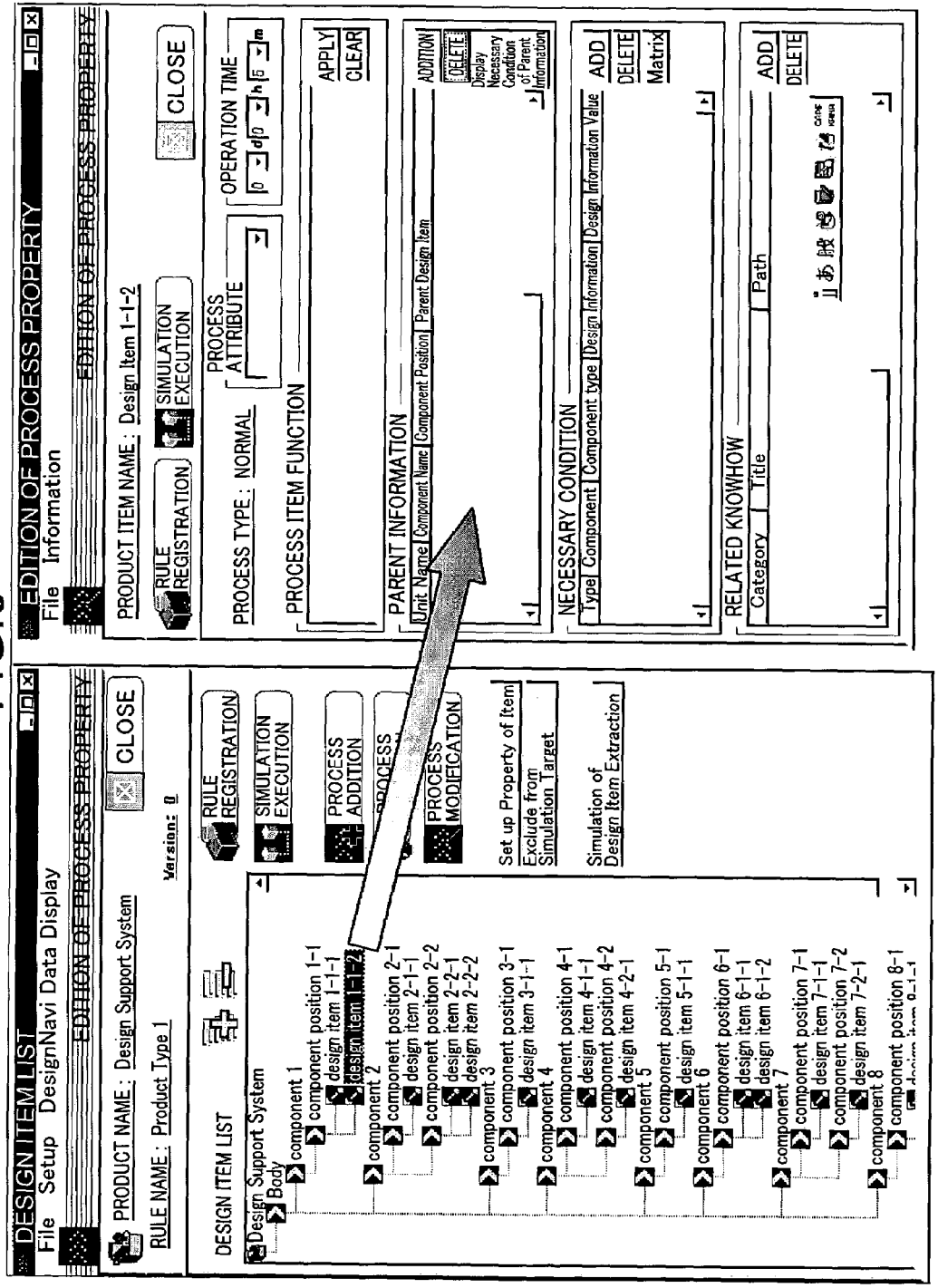
[FIG. 6]
A dialog box for setting the correlation between design items and design specifications or between design items and circuit components, according to one embodiment of the present invention.

The "necessary condition" will be described below. When the operator clicks on the "necessary condition" button on the dialog box in FIG. 1, a window as shown in FIG. 6 is displayed. A box tilted "Necessary Condition" in FIG. 6 is used to define the correlation between the design items set in FIGS. 5A and 5B and the aforementioned design specification or circuit component (see S206).

A number of design items enumerated in FIG. 5A cyclopaedically include not only design items required for designing specific one version of a certain product but also all design items required for designing using this system. For example, while the number of design items required for designing one version belonging to a product category of portable phones is about 300, the total number of design items required for designing all versions of portable phones subject to this system can go up to several thousands. In this case, all design items of a certain product are listed on the tree on the left side of FIG. 5A. That is, design items required for designing specific one version of the product are included in the tree as only a part of the design items listed thereon. The information set up through the "Necessary Condition" box in the right dialog box in FIG. 6 defines conditions for extracting design items required for designing the specific version from the entire design items.

When the operator clicks on an "Addition" button on the right side of the "Necessary Condition" box, a dialog box as shown in FIG. 7 is displayed. This dialog box is configured to display all of the design specifications and circuit components which have already been registered through the dialog boxes in FIGS. 3 and 4. If the operator selects one desired circuit component from a box titled "Circuit Component List" on the left side of the dialog box in FIG. 7, and clicks on a checkbox at the head of the row of the selected circuit component, a check mark will be displayed on the checkbox. This check mark indicates that the correlation between the target design item (design item 1-1-2 in FIG. 7) and the selected circuit component has been set up. In the same way, if the operator selects one desired design specification from a box titled "Design Specification List" on the right side of FIG. 7, and clicks on a checkbox on the head of the row of the selected design specification, a check mark will be displayed on the checkbox. This check mark indicates that the correlation between the target design item (design item 1-1-2) and the selected design specification (design specification 1=value 1a) has been set up. The information about the above correlations between design specifications and the circuit components will be used to extract required design items in accordance with design specifications or circuit components in the execution mode (see S1208).

Figure 8:
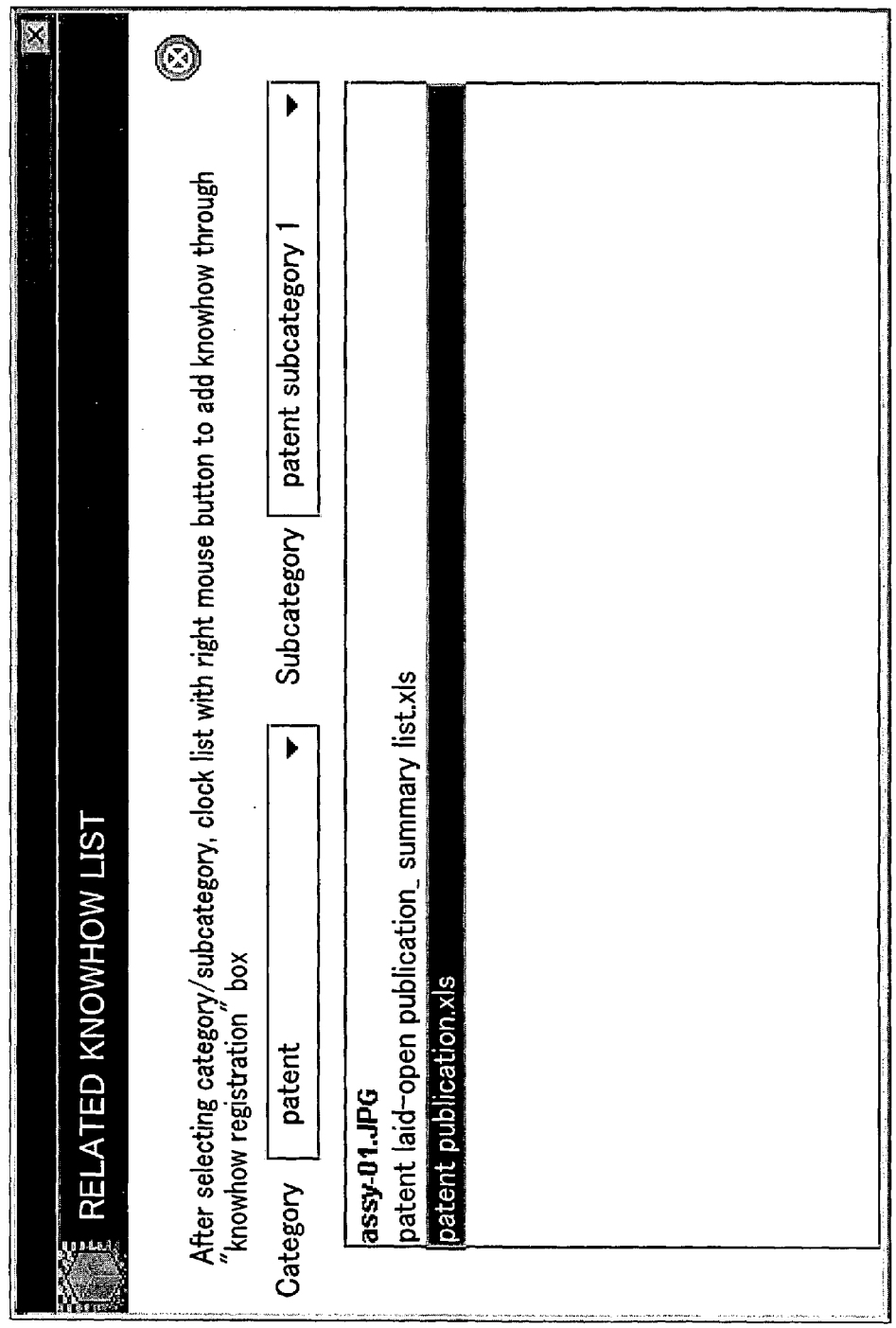
[FIG. 8]
A dialog box showing a process of registering related knowhow, according to one embodiment of the present invention.

Then, when the operator pushes a "+" button on the right side of the "Related knowhow" box in FIG. 5B, a window as shown in FIG. 8 is displayed. FIG. 8 shows a process of registering a related knowhow. Various knowhows related to design jobs are pre-stored in a database in the form of documents. These documents are prepared by performing inquiry/interview with skilled engineers or accumulated through actual design jobs using this system. This window is used to correlate each of the design items with one or more of the stored documents related thereto.

As show in FIG. 8, the displayed dialog box is configured to list files in a folder storing documents capable of being registered as related knowhow. These files are documents stored as a commonly used application file such as Excel or Word (registered trademarks of Microsoft Co., Ltd.). The contents of these documents include patent information about the target design item, information about concerns or defects of the product, advisory/cautionary information about design jobs, and so-called knowhow.

Figure 9:
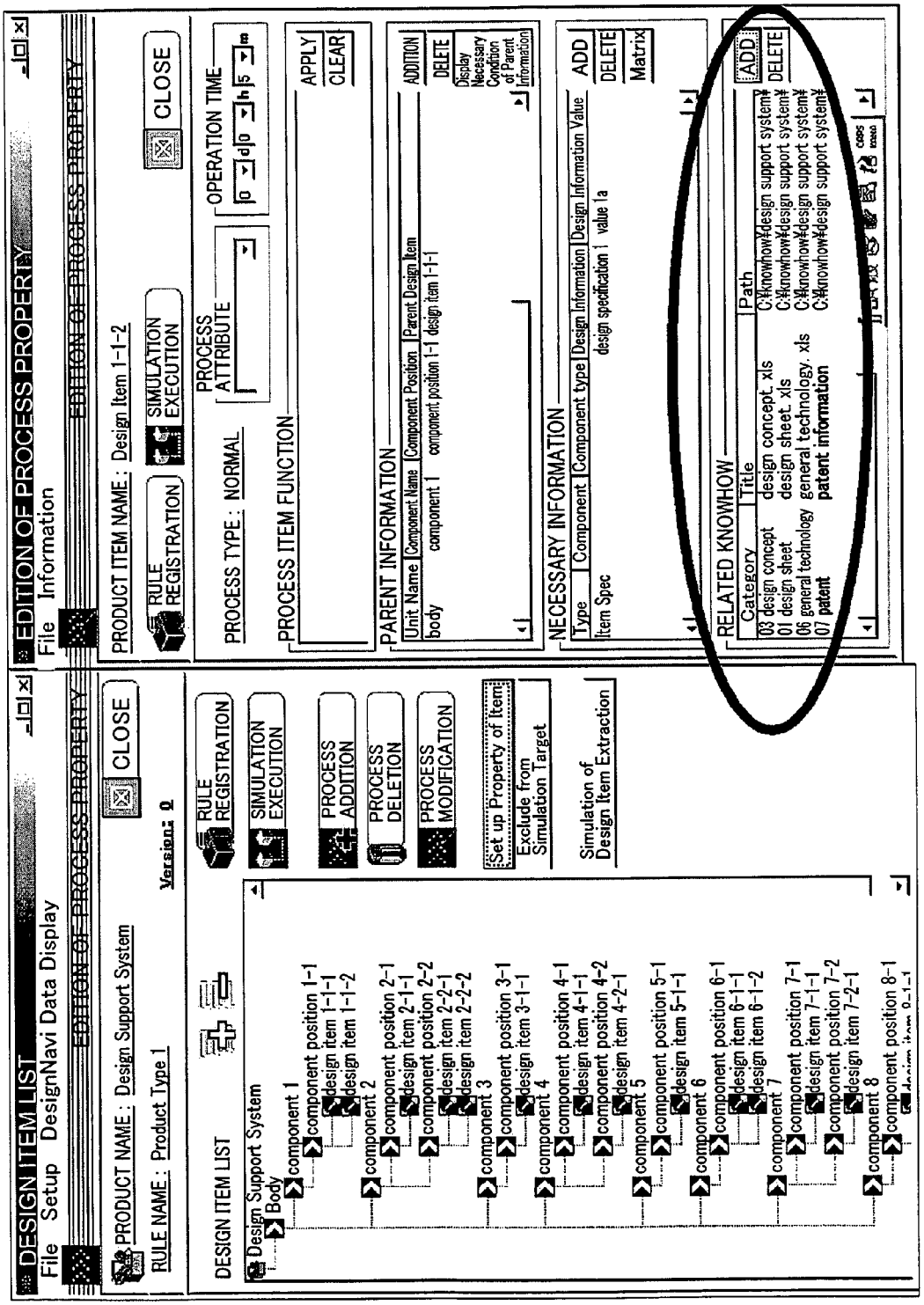
[FIG. 9]
A dialog box for registering selected documents on a "Related Knowhow" box, according to one embodiment of the present invention.

In response to clicking on an "Open" button after selecting appropriate one of the documents in FIG. 8 ("patent publications" are listed in this figure as a typical example), the selected document is registered in the "Related Knowhow" box, as shown in FIG. 9. If the operator decides that the registered document is unnecessary, the document can also be readily deleted. In this operation, data actually registered in the "Related Knowhow" box is a path to the document displayed thereon. Specifically, in response to clicking on either one of the documents displayed on the "Related Knowhow" box in the after-mentioned detailed design, an application associated with the document is automatically activated. Then, a file of the document is read in the application, and displayed.

After information about the "design item 1-1-2" are fully entered in the property edition window in FIG. 5B, a "Close" button on the upper right side of FIG. 5B can be clicked to store the entered contents as the properties of the "design item 1-1-2".

As described above, design items and other items than the design items can be bilaterally altered. For example, when the operator selects the "design item 1-1-1" displayed on the dialog box in FIG. 5A with the mouse, a "Shift to Simulation Target" button (not shown) is displayed on the right side of the tree. Then, the operator can click on this button to register the "design item 1-1-1" as a design item. The term "registering as a design item" can also be expressed that the design item becomes one element constituting an after-mentioned design flow diagram. Otherwise, when the operator selects one of the already registered design items, a "Preclude from Simulation Target" button will be displayed. Then, if the operator clicks on this button, the selected item will be precluded from a design item. The operator will appropriately perform the above operation to add, alter and delete items and to register items as design items.

As described above, all of the items at the lowest level, such as the "design item 1-1-1", are registered as a design item, and a triangular mark displayed on the head of each of the design item names graphically indicates that the item has been registered as a design item.

Differently from the items at the lowest level, any of the items at the upper levels are not registered as a design item, and a "reverse <" mark (hereinafter referred to as "rightward mark") displayed on the head of each of these items graphically indicates that the item has not been registered as a design item.

The item with the triangular mark is a design item or a simulation target. In the state after the item with the triangular mark is selected, the "Prelude from Simulation Target" button is displayed. If the operator clicks this button, the item will be precluded from a simulation target (design item), and the mark displayed on the head thereof will be changed to the rightward mark. In this case, the information about the properties of this item entered through the dialog box in FIG. 5B will be maintained without deletion, and can be used in subsequent processes. Otherwise, in the state after the item with the rightward mark is selected, a "Simulate" button (not shown) is displayed. If the operator clicks this button, the item will becomes a design item, and the mark displayed on the head thereof will be changed to the triangular mark.

Figure 10:
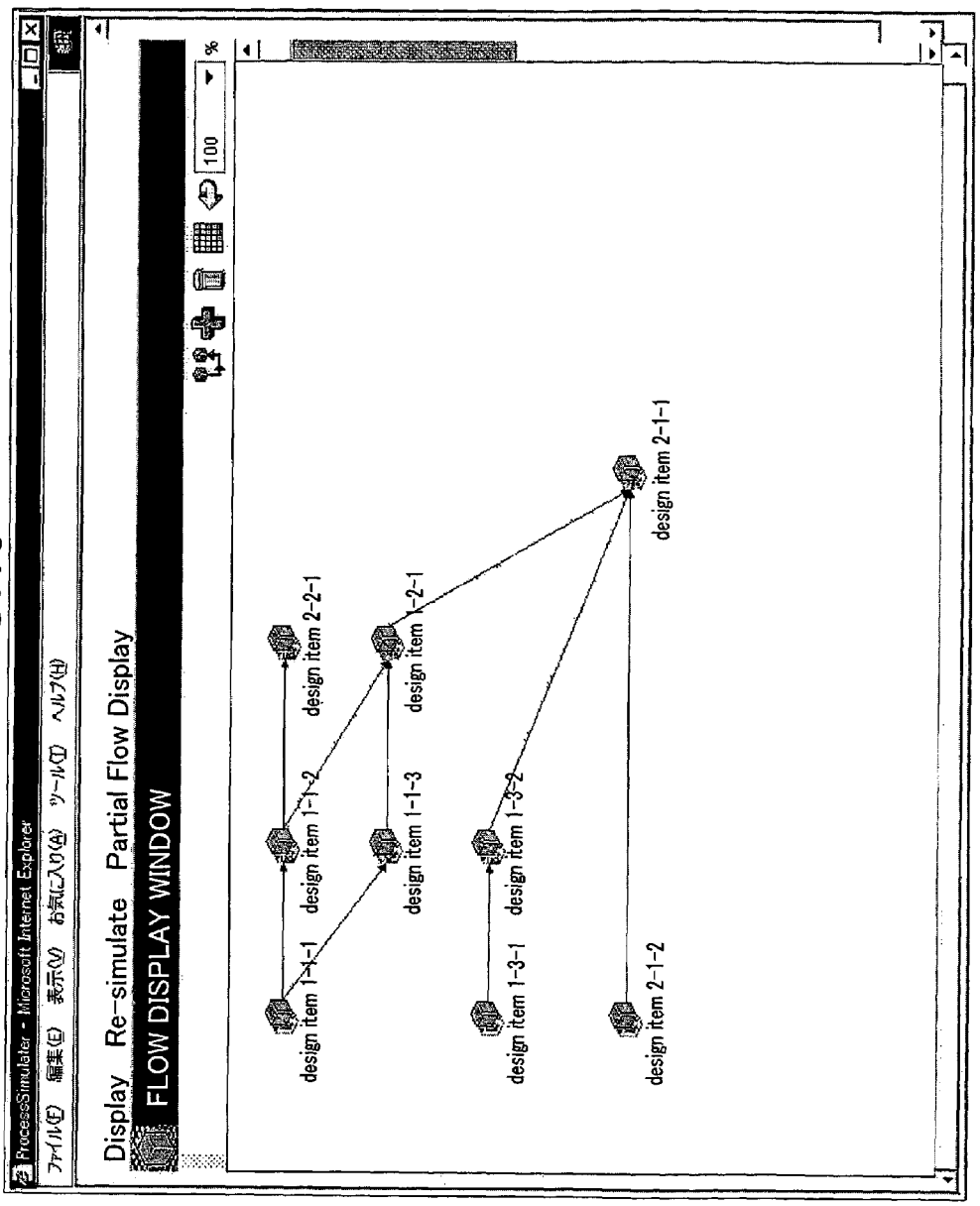
[FIG. 10]
A dialog box showing a design flow created with reference to "parent information", according to one embodiment of the present invention.

In response to clicking on a "Simulate" button on the upper right in FIG. 5A, the system extracts simulation targets or design items from the entire items, and refers to the aforementioned information about "precedent design item" about each of the extracted design items to create a design flow diagram as shown in FIG. 10. This design flow diagram is a prototype but not a finished or final design flow diagram.

The specific operation process of the aforementioned "setup mode" can be summarized as follows. In case where one R & D section is intended to develop a new product, for example a portable phone and to design each version of the product under the support of this system, inquiries/interviews are first carried out for engineers knowledgeable about the design of portable phones to acquire information about what kind of design items, design specifications and circuit components is required. The obtained information is roughly classified into design specifications, circuit components and design items, and registered through the windows in FIGS. 3, 4 and 5. Then, necessary information for each of the design items is entered through the property edition window in FIG. 5B.

In this manner, requited information about the design specifications, circuit components and design items of the product is sufficiently registered through the setup mode. This information makes it possible to navigate a design engineer who actually designs specific one of product versions belonging to the same category, in the "concept design" and "detailed design" of the following execution mode.

[Concept Design]

Figure 11:
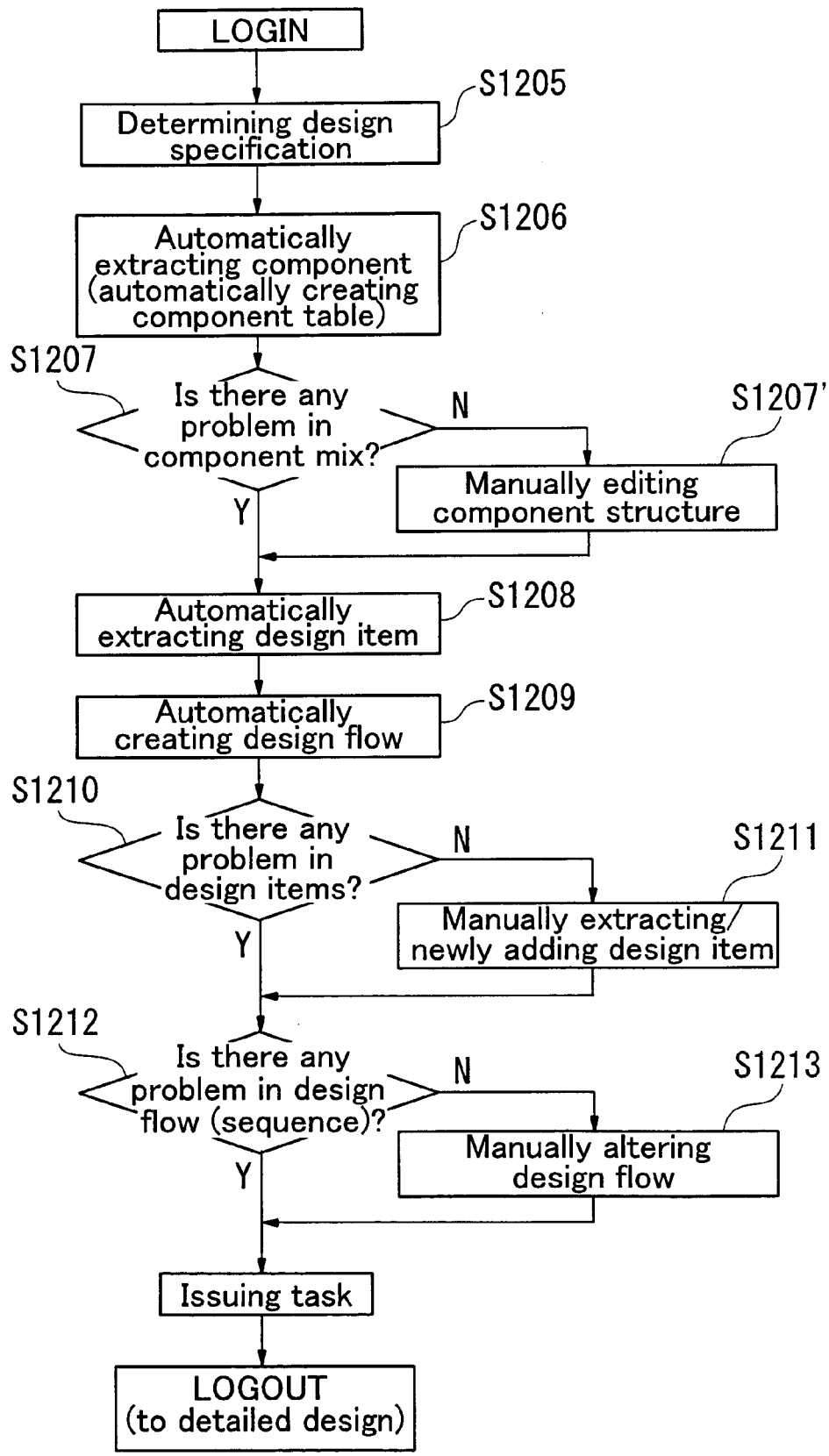
[FIG. 11]
A schematic flowchart showing a procedure in a concept design according to one embodiment of the present invention.
Figure 12:
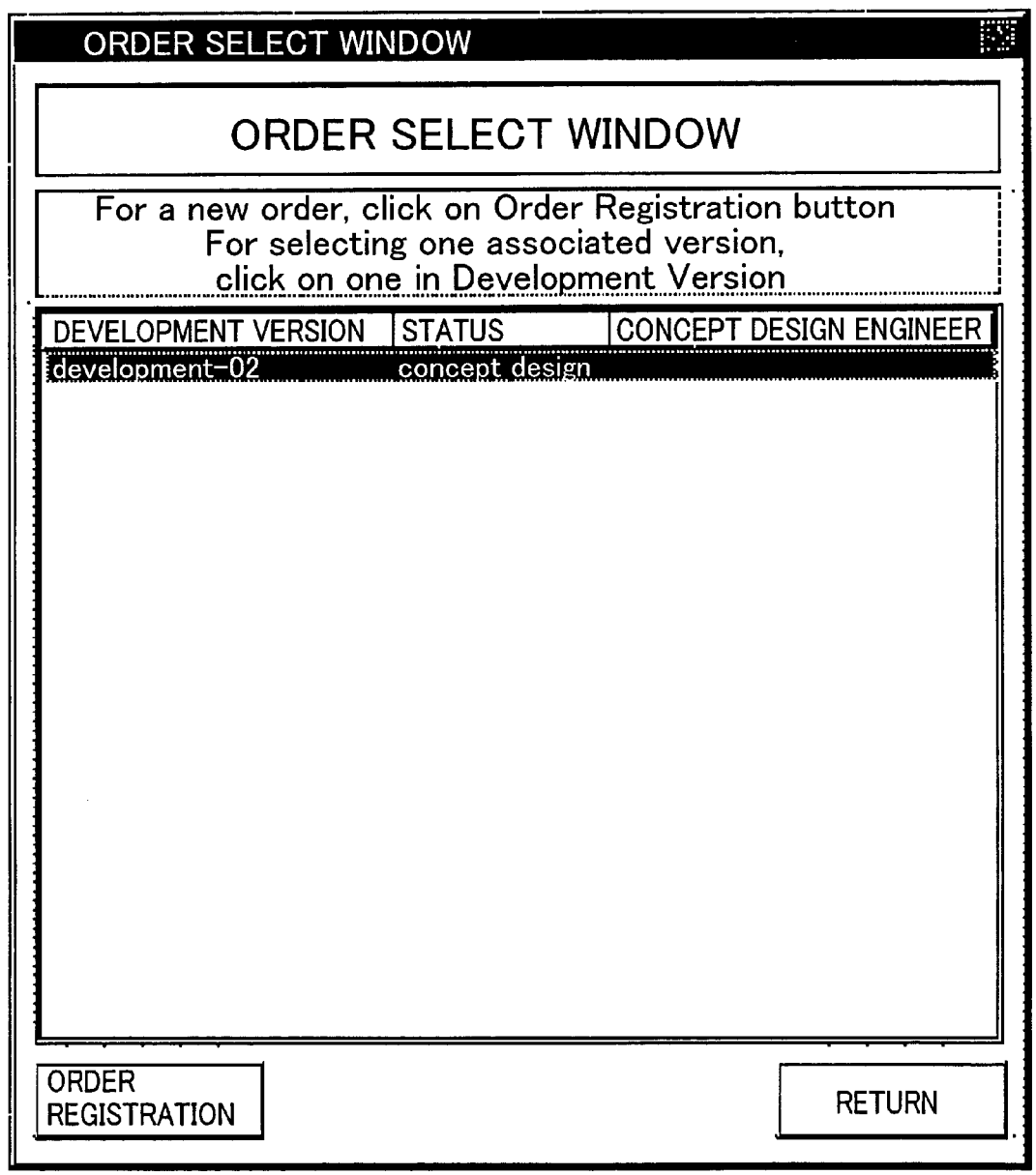
[FIG. 12]
A dialog box for selecting an order (version) according to one embodiment of the present invention.

The concept design as one of the sub-modes of the execution mode will be described below. FIG. 11 is a schematic flowchart of the procedure of the concept design. When an operator or concept design engineer clicks on the "Concept Design" button of the window in FIG. 1, a dialog box as shown in FIG. 12 is displayed. On this dialog box, a certain number of orders have already been displayed in the form of list, and the concept design engineer can simply select associated one of the orders (versions). In the example of FIG. 12, only one order titled "development-02" is displayed. If no order associated with the concept design engineer is registered, the concept design engineer can register a new order by him/herself.

Figure 13:
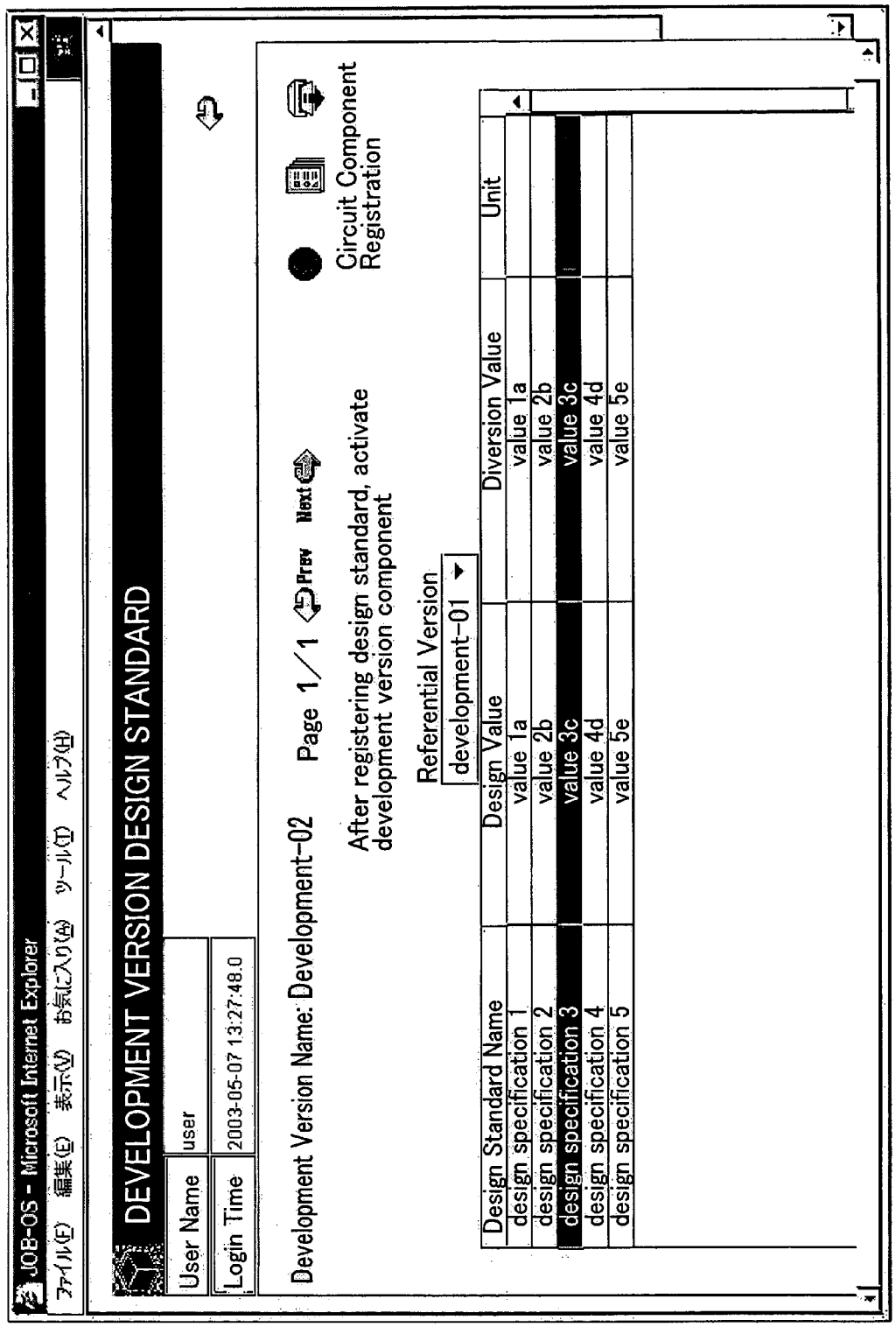
[FIG. 13]
A dialog box for entering a design value of a design specification, according to one embodiment of the present invention.

When the concept design engineer clicks on the order "development-2" on the dialog box in FIG. 12, a dialog box "Development Version Design Standard" as shown in FIG. 13 is displayed. The dialog box in FIG. 13 is used to enter the contents or design values of each of design specifications required for designing the portable phone ("design specification 1", "design specification 2", "design specification 3", - - -, which are displayed on a box titled "Design Standard Name" box in the center of FIG. 13) into a blank column titled "Design Value" (see S1205).

In order to facilitate the input operation on design specifications and give inexperienced engineers a hint on designing, the dialog box is configured such that design values of a previously developed similar version if any can be diverted. In case of diverting a part of design values of a previously designed version, the concept design engineer can click on a downward arrow on the right side of an input box titled "Referential Version Name" displayed in the center of the dialog box in FIG. 13 to select one of registered versions. FIG. 13 shows the state after a "version-01" as one of the registered versions is selected, and the design value of the "version-01" is displayed on a field titled "Reference Value".

While input values are entered in the form of "value 1a" or the like on the "Design Value" and "Referential Value" columns in FIG. 13, specific numerical values are actually entered. For example, if the design specification is the dimension of a circuit board, the dimension will be entered in a given length unit. If the specification is "power consumption" as an acceptance value in power consumption measurement, e.g. 1 W, will be entered. The concept design engineer can determine design specifications for the "development-2" to be newly developed, with reference to the design values of the design specifications of the "version-01. For example, in case where if it is allowed to use the same design specifications in different versions at high rates, as in the design of portable phones, many previously created design specifications can be diverted to facilitate reduction in necessary operation time as compared to a conventional process of creating design specifications from nothing.

As mentioned in connection the setup mode, when a certain design specification is determined, a required circuit component can be automatically extracted from the circuit component list pre-registered in the database according to the determined design specification (S1206), because the correlation between the design specification and the circuit component has been defined (FIG. 4) and registered in the database (S205). FIG. 13 shows the state after design specifications are fully entered.

Figure 14:
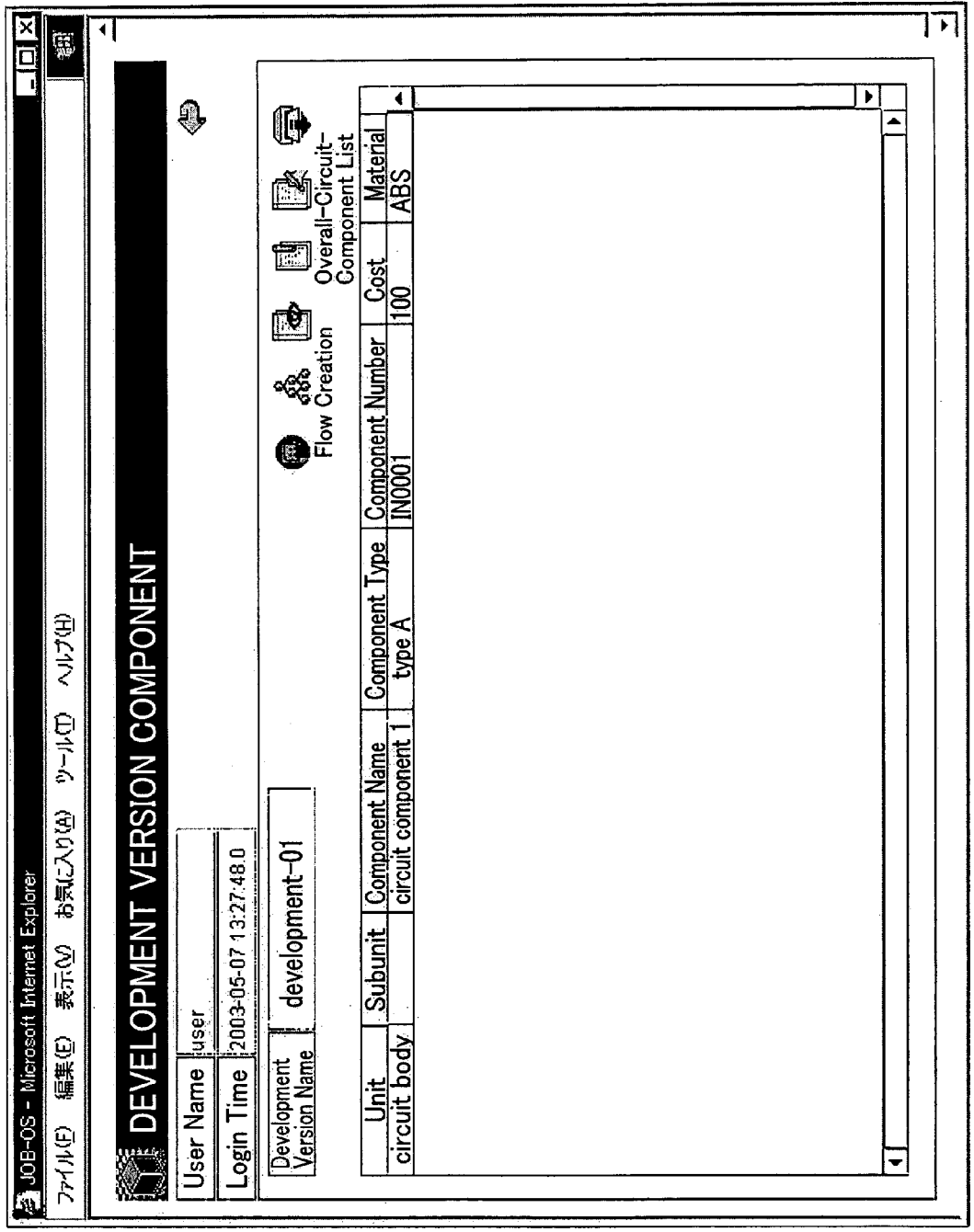
[FIG. 14]
A dialog box for registering circuit components, according to one embodiment of the present invention.
Figure 16:
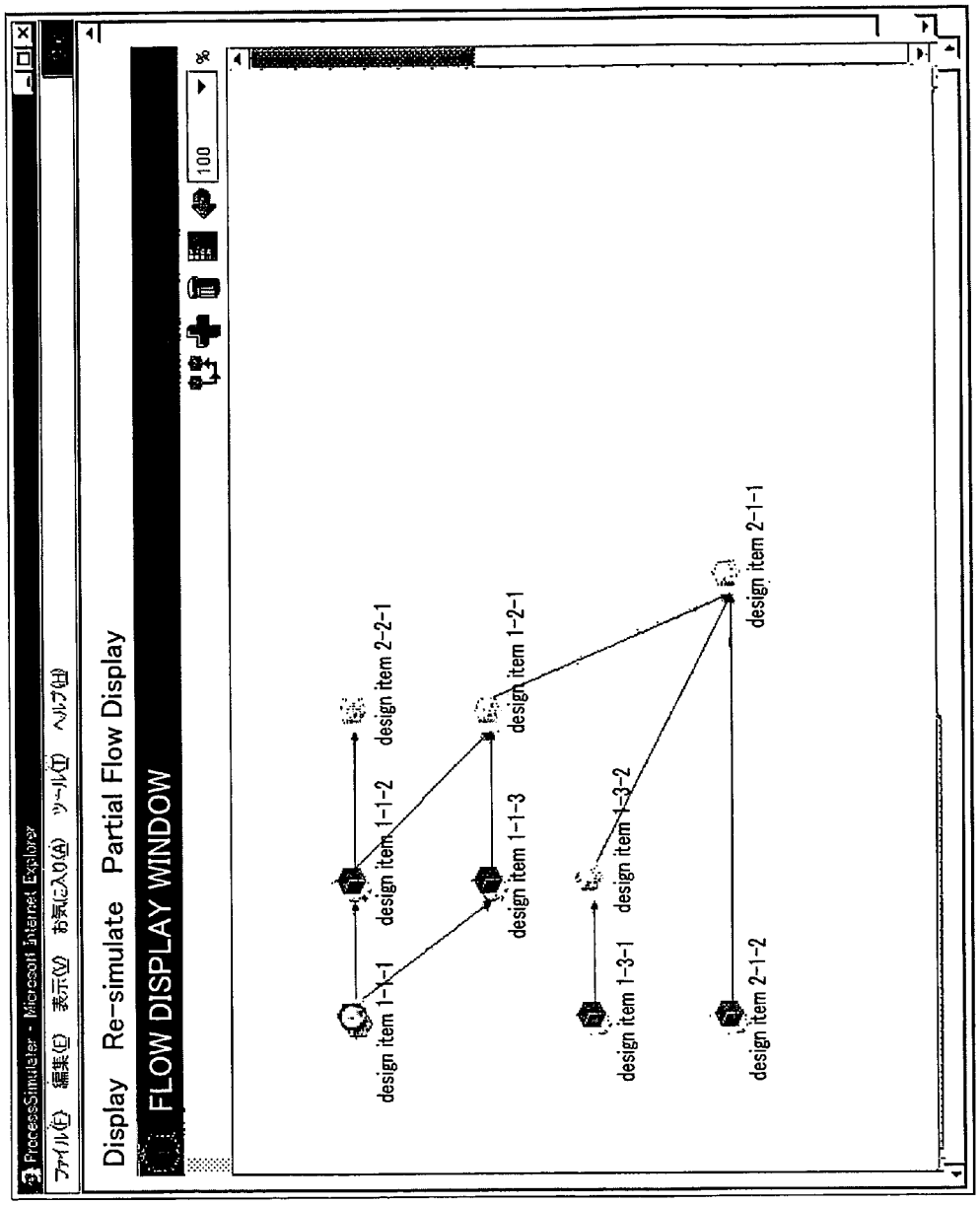
[FIG. 16]
One example of a created design flow, according to one embodiment of the present invention.

In this state, a "Circuit Component Registration" button on the lower left side of the dialog box in FIG. 16 can be clicked to display a dialog box ("Development Version Component") for registering a circuit component as shown in FIG. 14 on the display screen.

As shown in FIG. 14, information about one circuit component is displayed on a single row. The information specifying each of the circuit components is displayed on fields titled "Unit Name", "Sub-Unit Name", "Component Name", "Component Type", "Component Number", "Cost", "Material". However, information is not always displayed in all of these fields. Further, the unit name of the circuit component displayed on the "Unit Name" field in the dialog box illustrated in FIG. 14 turns out to be "body". The concept design engineer performs addition, deletion and/or alteration on the displayed circuit component in conformity to a product version intended to be designed this time, so as to determine circuit components required for the version, and registers the determined circuit components through the dialog box in FIG. 14.

The system according to this embodiment has a function of displaying all of the circuit components registered in the setup mode so as to facilitate addition, alteration and deletion on circuit components. Specifically, in response to clicking on an "Overall-Circuit-Component List" button on the dialog box in FIG. 14, all of the circuit components registered in this system are displayer as shown in FIG. 15. While not clearly shown in FIG. 15, only the components selected for the version "development-02 to be designed this time are displayed with a specific color different from that of the remaining displayed components. Thus, upon displaying the "Overall-Circuit-Component List" in FIG. 15, the components selected through the circuit component table in FIG. 14 can be instantly distinguished from others. If it is necessary to newly add an unselected circuit component, the concept design engineer can click on a "Registration" button on the upper right side of FIG. 15 to add the circuit component to the circuit component table in FIG. 14.

In reverse to this operation, if the concept design engineer determines that the circuit components automatically selected by the system in accordance with the information set up in the setup mode includes unnecessary one for the version, he/she can select a row including the unnecessary circuit component and click on a "Delete" button ("x" button) to delete the circuit component from the circuit component table in FIG. 14. When the circuit component table in FIG. 14 is subsequently displayed, the row which has included the deleted circuit component is displayed with a color for the non-selected components.

As mentioned above, the information about respective costs of circuit components can be registered through the "cost" field in the setup mode so as to accumulate the costs of circuit component the use of which are determined in this concept design stage, and to present a cumulative total cost to an operator in design stage.

Upon completion of the above determination of the design specifications and the circuit components, the system goes into the state allowing any design item required for designing this version to be extracted in accordance with the information set up in the setup mode (S1208). Thus, when the concept design engineer clicks on a "Flow Creation" button on the upper right side of FIG. 14, the system can internally extract design items for this version, and supply the extracted design items and the aforementioned "precedent design item" for each of the extracted design items to an algorism for creating a flow diagram so as to create a design flow diagram.

FIG. 16 shows one example of a design flow diagram created in this way. In this design flow diagram, square marks with a note, such as "design item 1-1-1", displayed on the underside thereof indicates the design items, respectively. The horizontal axis represents the lapse of an operation time (in the rightward direction). That is, when comparing any two of the design items (e.g. "design item 1-1-1" and "design item 2-1-1"), one ("design item 2-1-1") located at a position more rightward than that of the other must be temporally executed later. Further, the design items located at the same position on the horizontal axis may be concurrently executed. For example, in FIG. 16, any one of the "design item 1-1-1, the "design item 1-3-1" and the "design item 2-1-2" may be initiated earlier than others. Otherwise, a plurality of design engineers sharing jobs can concurrently execute them.

The following facts can be seen in FIG. 16. Firstly, the completion of the design item 1-1-1 allows the design item 1-1-2 and the design item 1-1-3 to be initiated. While the design item 2-2-1 can be executed if only the design item 1-1-2 is completed, the design item 1-2-1 can be executed only after both the design item 1-1-2 and the design item 1-1-3 are completed. Further, the design item 2-1-1 can be executed only after the three design items 1-2-1, 1-3-2 and 2-1-2 are completed. Thus, the above graphical representation of the relationship of the design items advantageously allows an operator to visually figure out the progress of the entire design jobs and the presently initiatable design items. In the example of FIG. 16, the design items 1-1-2, 1-1-3, 1-3-1 and 2-1-2 are designable, and displayed with a different color from those of the remaining design items in a flickering manner.

One of the futures of this system is in that in the process of creating the design flow chart in FIG. 16, an adequate design flow can be created by defining only the information (parent information) about the respective parent design items of the extracted design items, as described above.

Figure 17:
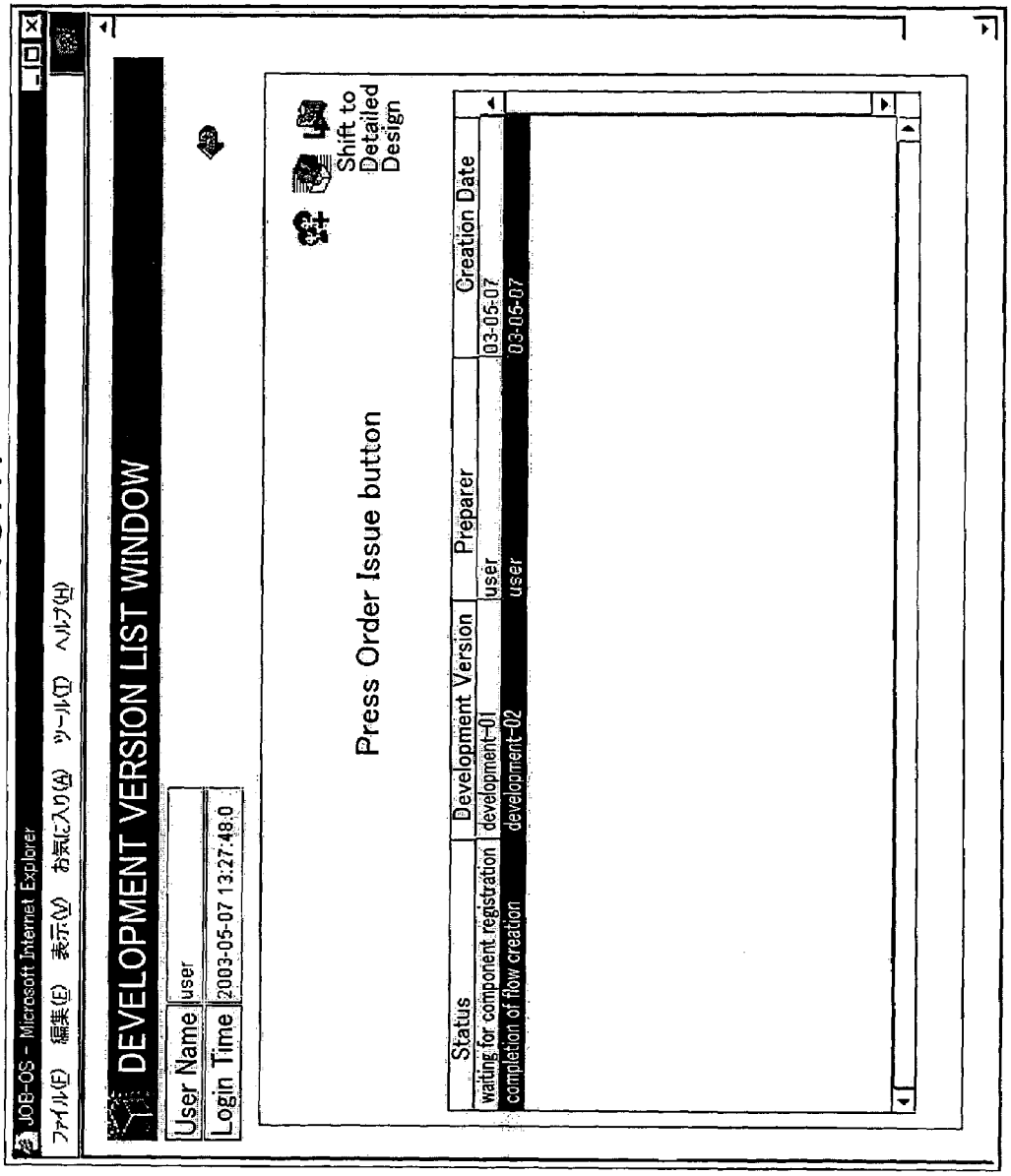
[FIG. 17]
A dialog box for a "task issue" operation for informing the completion of the concept design in response to the completion.
Figure 18:
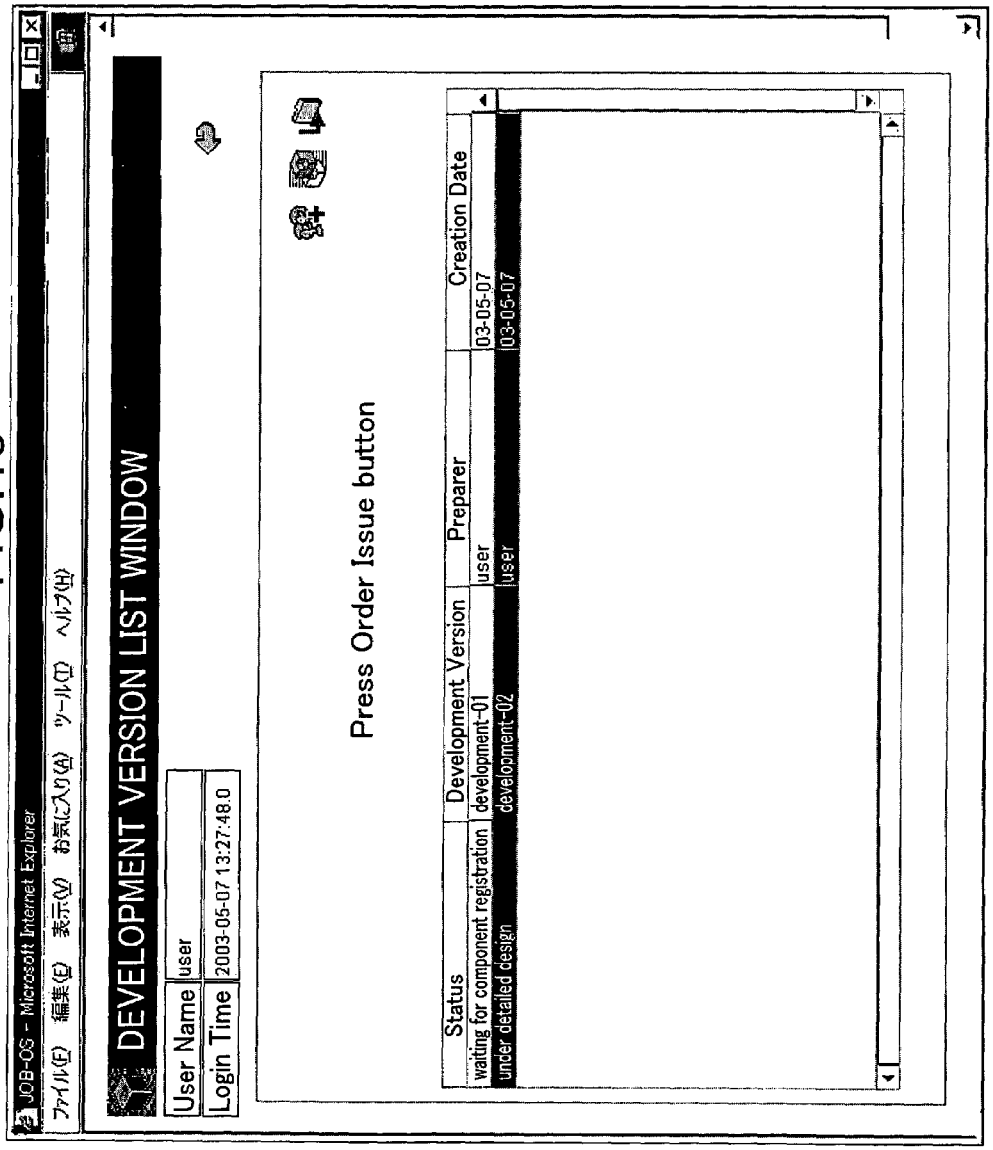
[FIG. 18]
A dialog box showing a "Development Version List Window" in the concept design in the state after a task is shifted to a detailed design, according to one embodiment of the present invention.

An operation for informing the system of the completion of the concept design is performed using an "Order Issue" button as shown in FIG. 17. This dialog box is has the same function as that in FIG. 12. Specifically, when the concept design engineer selects a row of the "development-02", and clicks a "Shift to Detailed Design" button on the upper right side of FIG. 17. Consequently, the task "development-2" is shifted from the concept design to the detailed design. Specifically, the display "development-2" on the "Order Select Window" for the concept design is changed to "under detailed design" as shown in FIG. 18, and the task is shift to the following detailed design.

[Detailed Design]

Figure 19:
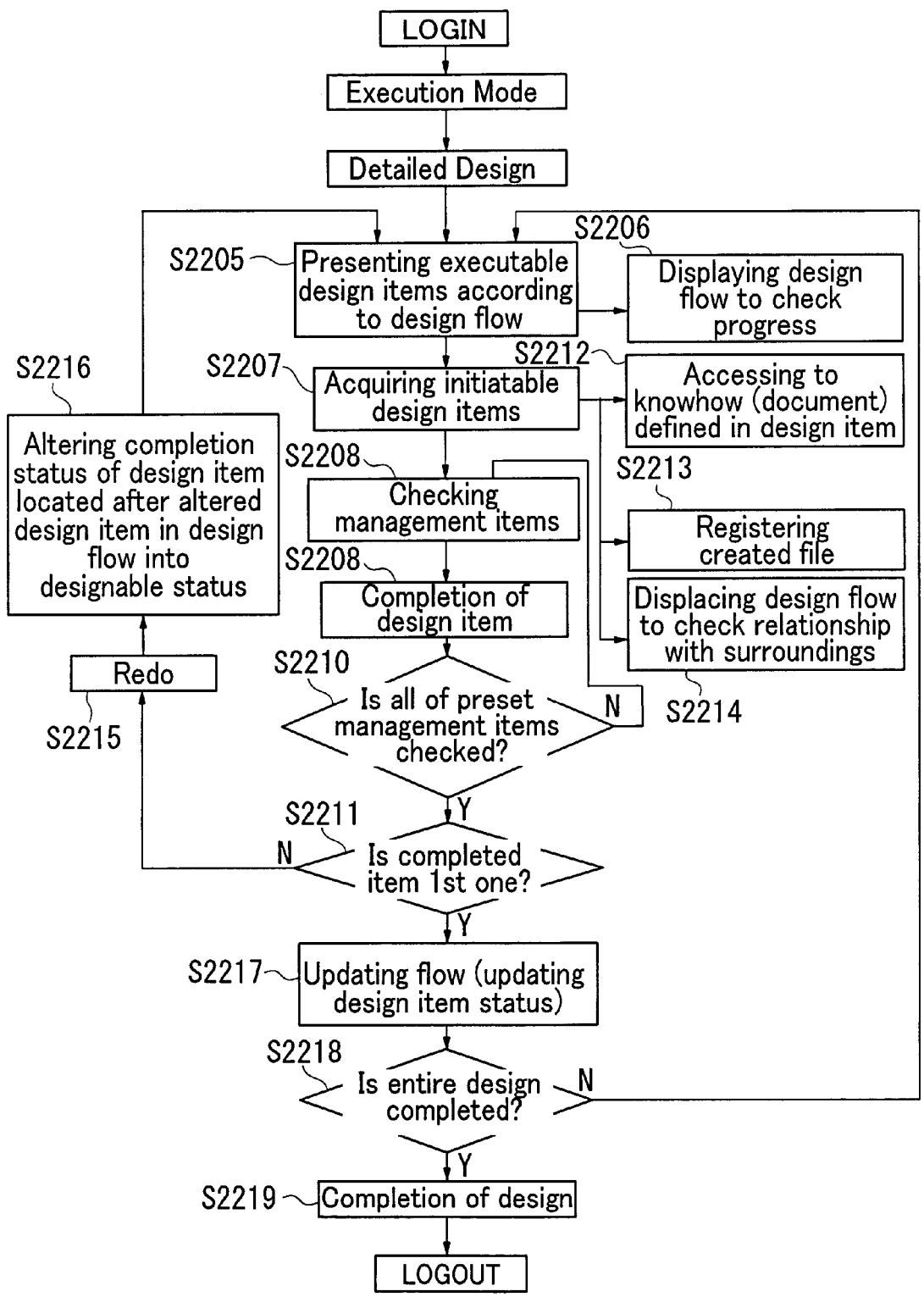
[FIG. 19]
A schematic flowchart showing the detailed design as one of sub-modes of an execution mode, according to one embodiment of the present invention.
Figure 20:
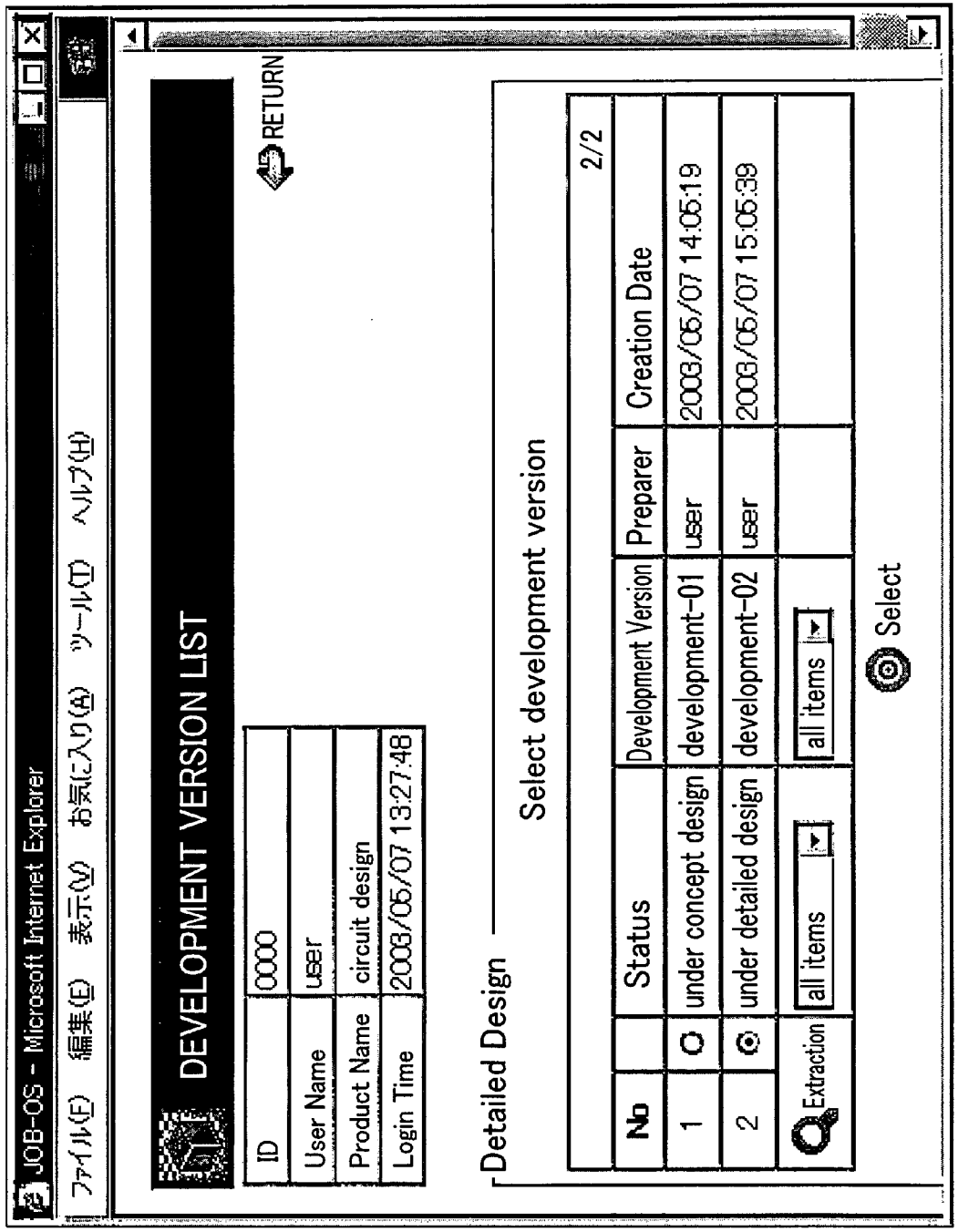
[FIG. 20]
A dialog box for selecting a development version in the detailed design, according to one embodiment of the present invention.

The detailed design will be described below. FIG. 19 is a schematic flowchart showing the entire process of the detailed design. In the procedure of the detailed design, a process of entering a user name and a password and clicking of an "OK" button on a login window (not shown) to display the dialog box in FIG. 1 is the same as that in the "setup mode" and the "concept design". In response to clicking on the "Detailed design" button on the dialog box in FIG. 1, a dialog box as shown in FIG. 20 is displayed. This dialog box acts to perform "development version selection", and corresponds to the dialog box in FIG. 12.

If the design standard/component are determined, and the design flow is created, in the concept design as the precedent stage of the detailed design, the icon "Sift to Detailed Design" in FIG. 17 will be allowed to be pressed, and this icon can be clicked to shift a task from the concept design to the detailed design. As a result, the task "development-2" exists on the dialog box in FIG. 20.

In response to clicking on the cell "development-2" of the dialog box in FIG. 20, design items in the detailed design to be designed for the "development-2" are displayed in the form of list as shown in FIG. 21 (S2205). The design items displayed as a list correspond to the design items in the design flow diagram illustrated in FIG. 16. An operator executing the detailed design can view the list in FIG. 21 to readily recognize a design item to be designed by him/herself.

The list in FIG. 21 is provided with fields titled "Status", "Development Version Name", "Unit", "Component Name", "Design Item Name", "Preparer" and "Creation Date". The "Component Name" field indicates to which of components a job for the target design item relates. The "Status" field is provided to indicate whether the target design item is in a status allowing its design job to be initiated. The name of a design engineer who is designing or has designed the target design item is displayed on the "Preparer" field. The "Date" field displays a date when the target design item is completed. The "Unit" indicates with which of units the target design item is associated As described in connection with FIG. 16, whether the job for the target design item can be initiated is determined by whether the completion of another design item as a prerequisite for initiating the target design item has been done. As seen in FIG. 21, in the "Status" field, only a "designable" design item is displayed in a normal display, and an "undesignable" design item is displayed with light color. The four "designable" design items 1-1-2, 1-1-3, 1-3-1 and 2-1-2 in FIG. 21 correspond to the four design items displayed as designable in the flow diagram of FIG. 16. The operator may selectively initiate any one of these four design items.

Figure 24:
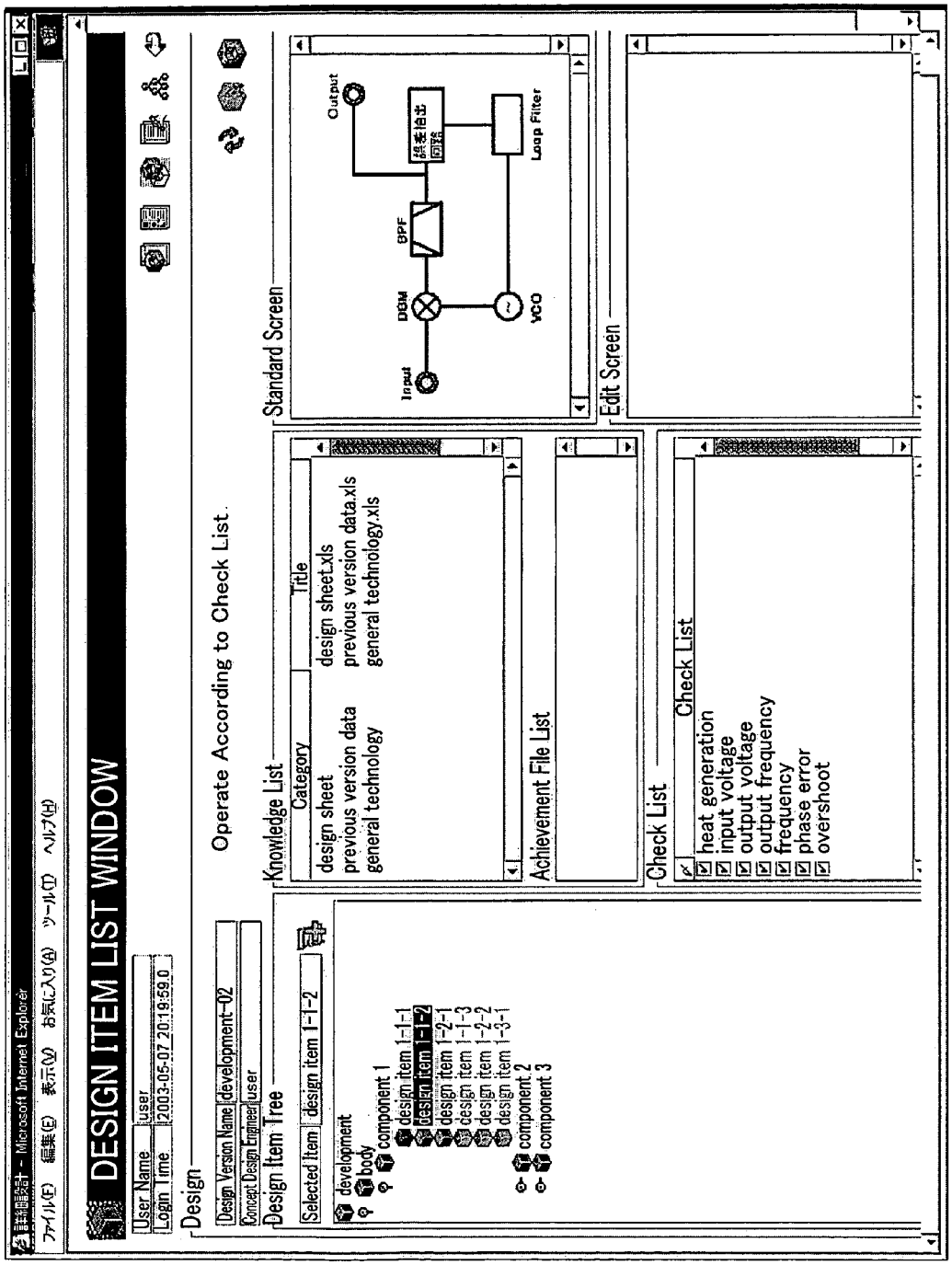
[FIG. 24]
A dialog box showing the state after all items are marked, according to one embodiment of the present invention.

The system is configured such that in response to clicking on a "Flow View" button on the bottom of the dialog box in FIG. 24, approximately the same design flow diagram as that in FIG. 16 is displayed (S2206). Thus, the operator can readily refer to the design flow diagram according to need. In this displayed design flow diagram, the four design items which are presently "designable" are displayed in a flicker manner with a different color from those of other design items. This allows the operator to instantly figure out the current status in the entire design process.

In FIG. 21, when the operator clicks on either one of the four design items in which a design job can be initiated, the system recognizes as a status where the job for the clicked design item has been initiated.

Figure 22:
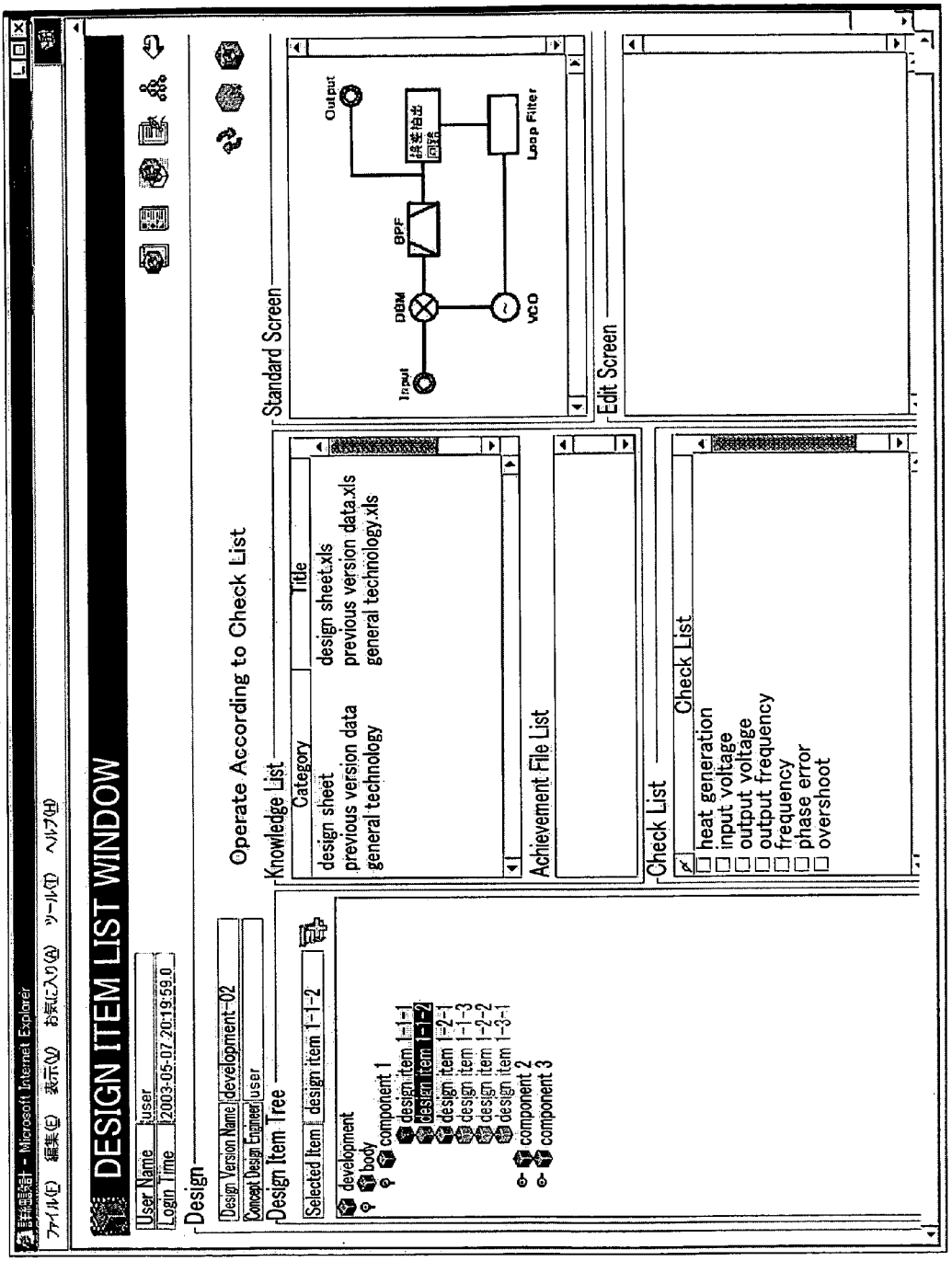
[FIG. 22]
A window for use in the detailed design of a selected design item, according to one embodiment of the present invention.

Then, if the uppermost "design item 1-1-2" is selected, a detailed design window of this design item will be displayed as shown in FIG. 22.

On the left field in FIG. 22, the entire design process is displayed in a tree structure Further, the "design item 1-1-2" is displayed in a highlighted manner, and various information about the "design item 1-1-2" is displayed on the right field in FIG. 22.

For example, the "development-2" as a project name of this development is displayed on a field titled "Development Version Name". The name of an associated concept design engineer is displayed on a field titled "Concept Design Engineer" (displaced as "user" in FIG. 22), and a function to be achieved in the design item is displayed on a field titled "Item Function".

While the window in FIG. 22 is configured to allow new information to be added in this stage, it is fundamentally intended to present information about the job content required for the design item to a detailed design engineer so as to guide or navigate the detailed design engineer. The engineer executes an actual design job while facing to a terminal of a CAD system or the like, in conformity to the navigation according to this system.

In the "detailed design" stage, the design items can be determined in terms of not only general performances, such as amplifier gain or output impedance, but also an element meeting these performances, which is specified in its product name or manufacturer.

In a box titled "Check Item" on the dialog box in FIG. 22, items to be essentially executed by the operator are enumerated. The engineer marks a check box on the left side of each of the check items on the CAD system every time one of jobs for check items is completed (S2208). The system is also configured such that the job for the design item can be completed only after all of the check boxes of the items are marked (S2208, 2209). In this manner, even an inexperienced operator who cannot figured out check points in the design item can reliably execute a required job without missing out any job.

Further, a box titled "Standard Screen" on the right side of FIG. 22 displays an image of a portion of the circuit related to the design item. This image data is displayed by extracting data corresponding to the design item from design data of the CAD system. Thus, the operator can visually figure out the position of his/her job in the entire development process. While the engineer executes the design job on the CAD system according to instructions of the design navigation system, the two systems are generally independent to one another. In this case, if there is the need for switching the respective programs of the CAD system and the design navigation system in each case, or for moving from one to the other to use these systems due to the locations of two systems remote from one anther, such a need will lead to deterioration in inefficiency. Thus, in view of efficient operation, it is advantageous to allow design images on the CAD system to be referred on the design navigation system as in the system according to this embodiment.

Information listed on a box titled "Knowledge List" in the center of FIG. 22 corresponds to the "related knowhow" registered in the setup mode (see FIG. 9). The "Knowledge List" box displays the names of documents created in a commonly used application files, such as Excel or Word, and information useful in executing design jobs, such as knowhow and related patents, is described in the document files.

As one example, FIG. 22 shows an image displayed in response to clicking on a document titled "design sheet" on the "Knowledge box" field in FIG. 22 (S2212). The document "design sheet" is stored as an Excel file. In response to clicking on this document, Excel is automatically activated and read the file name "design sheet" to display the image as shown in FIG. 23. In this manner, the associated design engineer can quickly refer to the information registered in the "Knowledge List" box while executing the design job. Thus, even an operator having insufficient in practical design knowledge can efficiently executes a design job while refereeing to the knowhows and information described in these documents, at a standard or higher level.

FIG. 24 shows the state when all of the items in FIG. 24 are marked after the engineer executes the design job for each of the items listed on the "Check Item" box and repeats to click one of the check boxes every time one of the items is completed, for example, while operating CAD software on other terminal than the terminal running this system. Depending on design items, it is essentially required to enter a certain numerical value or letter through a keyboard or the like. Thus, while the "Check Item" box in FIG. 24 is configured to allow an operator to click and mark the check boxes, it may be configured such that the check box can be clicked only after the above numerical value or letter is entered.

Figure 27:
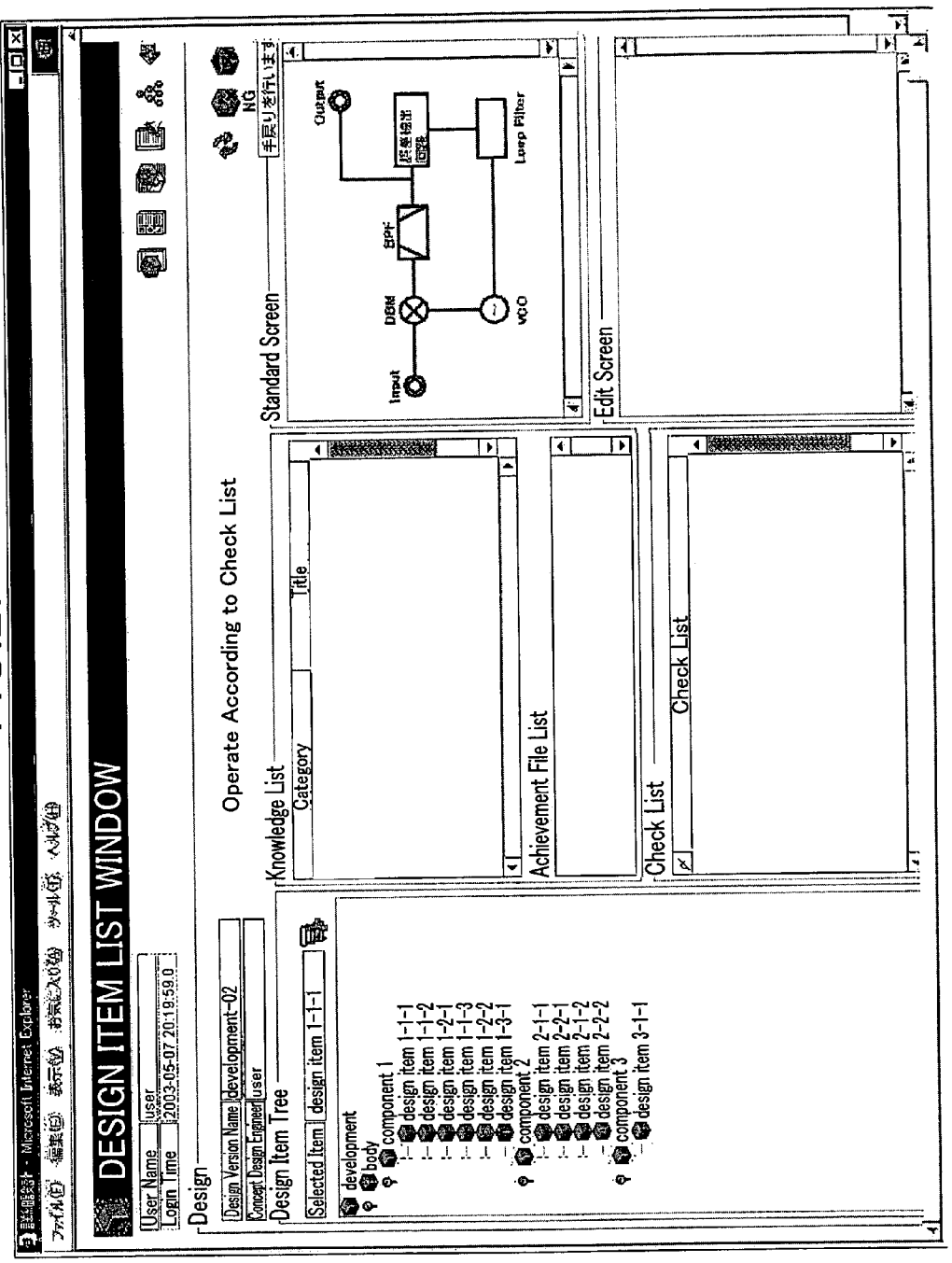
[FIG. 27]
A dialog box in the state when the design of the design item 1-2-2 is being executed, according to one embodiment of the present invention.

When the check mark is written in all of the check boxes of the design items displayed on the "Check Item" box in FIG. 24, the system allows a "Design Completion" button on the upper right side of FIG. 27 to be clicked. In this manner, this system can use a computer to navigate an operator while informing the operator of a design job to be executed in each stage. Thus, even engineers inexperienced in design jobs can avoid getting out of required design items.

Then, when the operator clicks on "Design Complete" button, the dialog box in FIG. 24 is closed, and then another dialog box as shown in FIG. 25 is displayed. This dialog box is similar to but partly different from the dialog box in FIG. 21. Specifically, in the dialog box in FIG. 25, the "State" field of the "design item 1-1-2" is changed to "design completion", and simultaneously the "State" field of the "design item 1-2-1" is changed to "designable" and a normal display.

Figure 26:
[FIG. 26]
A dialog box of a design process list, according to one embodiment of the present invention.

A "return" function will be described below. In case where it is required to redo a previously completed design item in a stage where the jobs in the detailed design progress to a certain extent, this function is effective to return to a desired design item in a simple operation. FIG. 26 is an explanatory diagram of this "return" function. FIG. 26 shows the dialog box of the design process list. As seen in the "State" field in FIG. 26, the design items displayed on the dialog box include some previously completed design items (displayed as "design completion"), and some presently designable design items (displayed as "designable").

Given that an operator is executing a job for the "design item 1-2-2" displayed as "designable" in the "State" field. FIG. 27 shows a dialog box in the state when the job for the "design item 1-2-2" is being executed.

The design item 1-2-2 (designable) is selected in FIG. 26, and thereby changed to a detailed window as shown in FIG. 27. In this window, the design item 1-2-2 is indicated by arrow because it is a design item under design.

In order to subject the "design item 1-1-1" to the returning operation (redo the "design item 1-1-1"), the "design item 1-1-1" is in its selected state (While the "design item 1-1-1" has been completed in the state of FIG. 26, it will be subjected to the returning operation when the design item 1-2-2 starts executing.

Figure 28:
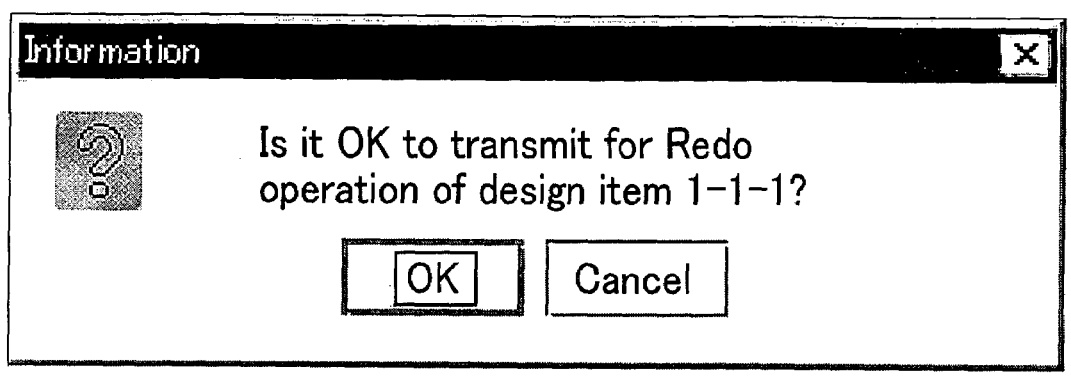
[FIG. 28]
A dialog box serving as a confirmation window for use in redoing the design of the design item 1-1-1, according to one embodiment of the present invention.

In this case, the "design item 1-1-1" in the tree structure on the left side of FIG. 27 is clicked and selected, and then a "NG" button is clicked on the upper right side of FIG. 27. As a result, a confirmation window as shown in FIG. 28 is displayed, and a "YES" button is clicked to display a new "Design Process List Window" as shown in FIG. 29. As seen in FIG. 29, a new "design item 1-1-1" is added, or total two "design items 1-1-1" are displayed. As seen in the "Status" field, the added "design item 1-1-1" is displayed as "designable".

FIG. 30 shows the change in design flow between before and after the return function is used. In FIG. 30(a) showing the design flow before the use of the return function, the "design item 2-2-2" is displayed with a first given color indicative of a presently executable design item.

By contrast, in FIG. 30(b) showing the design flow after the use of the return function, the "design item 2-2-2" is displayed with a second given color indicative of "design completion", and inversely the "design item 1-1-1 is displayed with the first given color indicative of a presently executable design item. Thus, the need for redoing the jobs for the "design items 1-1-2, 2-1-1 and 2-2-1" arises. For example, when the returned design item 1-1-1 is completed, the design items 1-1-2 and 2-1-1 which becomes designable in succession are displayed as their executable status in the design flow diagram in FIG. 30(b).

The engineer goes on design jobs by repeating the above operation. When all of the design items are finally completed, and all of the "State" fields of the design items are displayed as "design completion", as shown in FIG. 31(a), the system allows an "End Declaration" button to be clicked.

Then, when this button is clicked and an "OK" button on a confirmation window as shown in FIG. 31(b) is clicked, the order of "development-02" disappears from the "Order Select Window" as shown in FIG. 31(c). Through these operations, the detailed design is completed. In another embodiment, the system may be configured such that when all of the "State" fields on the window in FIG. 31(a) are displayed as "design completion", this information is sent to a concept design engineer, and the detailed design can be terminated only after the concept design engineer checks and approves the content of the detailed design.

EFFECT OF THE INVENTION

As mentioned above, according to the design support method and system of the present invention, information about design specifications, circuit components, design items, the correlations between the design specifications and the circuit components, and the correlations between the design items and the design specifications or between the design items and the circuit component, which are required for designing a circuit of a product, are registered in a database while giving given definitions to the information. This makes it possible: to prompt a design engineer to determine the content of the design specification with respect to a specific version of the product; to extract circuit components for the specific version from the database and present the extracted circuit components to a design engineer so as to prompt the design engineer to determine circuit components required for the specific version while performing addition, alteration and/or deletion the circuit component if required; to extract design items required for the specific version and present the extracted design items to the design engineer; and to present specific job content of the extracted design item to a design engineer engineer, and navigate and prompt the design engineer to execute the job content. Thus, even a design engineer insufficient in knowledge about design procedure/practice and inexperienced in design of the product can execute a design job at an average or higher level within reduced design period of time.

What is claimed is:

1. A method for supporting a design engineer who performs a circuit design of a given product, by means of a computer, said method comprising:

a setup step of registering in a database information about design specifications, circuit components, design items, the correlations between said design specifications and said circuit components, and correlations between said design items and said design specifications or correlations between said design items and said circuit components, which are required for the circuit design of said given product, while giving definitions to said information on said computer;

a design-specification determination step of using said computer to prompt the design engineer to determine content of said design specifications with respect to a specific version of said given product;

a circuit-component determination step of extracting circuit components for said specific version from said database in accordance with said design specification-circuit component correlations registered in said setup step, and presenting said extracted circuit components to the design engineer on said computer so as to prompt said design engineer to determine circuit components required for said specific version while performing addition, alteration and/or deletion on circuit components if required;

a design-item extraction step of using said computer to extract design items required for said specific version in accordance with said design item-design specification correlations or said design item-circuit component correlations registered in said setup step, and present said extracted design items to the design engineer; and a design-item execution step of using said computer to present to the design engineer specific job content of each of said design items extracted in said design-item extraction step, and navigate and prompt said design engineer to execute said specific job content.

2. The method as defined in claim 1, wherein said setup step includes determining temporal order relationships between said design items, and wherein a design flow diagram for the design items extracted in said design-item extraction step is created on said computer in accordance with a predetermined order relationship between said extracted design items and is presented to the design engineer.

3. The method as defined in claim 2, wherein said setup step includes setting up a correlation between each of said design items and a document related thereto, and registering information about said correlation in said database, and wherein said design-item execution step includes extracting the content of the document related to a design item subject to a specific job to be executed by the design engineer, if any, in accordance with said document-design item correlation, and presenting the content of said document to said design engineer.

4. The method as defined in claim 2, wherein said setup step includes registering respective costs of said circuit components in a database, wherein every time one of said circuit components required for said specific version is determined in said circuit-component determination step, the cost of said determined circuit component is read out from said database, and a cumulative cost of the previously determined circuit components is calculated and presented to the design engineer.

5. The method as defined in claim 2, which further includes a step of allowing any one of the design items which has been completed in said design-item execution step to be returned to its uncompleted status while keeping obtained data on said design item so as to re-execute said design item.

6. The method as defined in claim 1, wherein said setup step includes setting up correlation between each of said design items and a document related thereto, and registering information about said correlation in said database, and wherein said design-item execution step includes extracting content of the document related to a design item subject to a specific job to be executed by the design engineer, if any, in accordance with said document-design item correlation, and presenting the content of said document to said design engineer.

7. The method as defined in claim 6, wherein said document is a patent publication.

8. The method as defined in claim 6, which further includes a step of allowing any one of the design items which has been completed in said design-item execution step to be returned to its uncompleted status while keeping obtained data on said design item so as to re-execute said design item.

9. The method as defined in claim 1, wherein said setup step includes registering respective costs of said circuit components in a database, wherein every time one of said circuit components required for said specific version is determined in said circuit-component determination step, the cost of said determined circuit component is read out from said database, and a cumulative cost of the previously determined circuit components is calculated and resented to the design engineer.

10. The method as defined in claim 1, which further includes a step of allowing any one of the design items which has been completed in said design-item execution step to be returned to its uncompleted status while keeping obtained data on said design item so as to re-execute said design item.

11. A system for supporting a design engineer who performs a circuit design of a given product, said system comprising:

setup means for registering in a database information about design specifications, circuit components, design items, correlations between said design specifications and said circuit components, and correlations between said design items and said design specifications or correlations between said design items and said circuit components, which are required for the circuit design of said given product, while giving given definitions to said information;

design-specification determination means for prompting the design engineer to determine content of said design specifications with respect to a specific version of said given product;

circuit-component determination means for extracting circuit components for said specific version from said database in accordance with said design specification-circuit component correlations registered by said setup means, and presenting said extracted circuit components to the design engineer so as to prompt said design engineer to determine circuit components required for said specific version while performing addition, alteration and/or deletion on circuit components if required;

design-item extraction means for extracting design items required for said specific version in accordance with said design item-design specification correlations or said design item-circuit component correlations registered by said setup means, and presenting said extracted design items to the design engineer; and design-item execution means for presenting to the design engineer specific job content of each of said design items extracted by said design-item extraction means, and navigating and prompting said design engineer to execute said specific job content.

12. The system as defined in claim 11, wherein said setup means is operable to define the parent-children relationship between said design items, and wherein said system includes means for creating a design flow diagram of the design items extracted by said design-item extraction means, in accordance with the predetermined parent-children relationship between said extracted design items, and presenting said design flow diagram to the design engineer.

13. The system as defined in claim 12, wherein said setup means is operable to set up a correlation between each of said design items and a document related thereto, and registering information about said correlation in said database, and wherein said system includes means for extracting content of the document correlated with a design item subject to a specific job to be executed by the design engineer, if any, and presenting the content of said document to said design engineer.

14. The system as defined in claim 12, wherein said setup means includes means for registering respective costs of said circuit components in a database, and wherein said system includes means for, every time one of said circuit components required for said specific version is determined by said circuit-component determination means, reading out the cost of said determined circuit component from said database, calculating a cumulative cost of the previously determined circuit components, and presenting said cumulative cost to the design engineer.

15. The system as defined in claim 12, which said design-item execution means includes means for allowing any one of the design items which has been completed to be returned to its uncompleted status while keeping obtained data on said design item so as to re-execute said design item.

16. The system as defined in claim 11, wherein said setup means is operable to set up a correlation between each of said design items and a document related thereto, and registering information about said correlation in said database, and wherein said system includes means for extracting the content of the document correlated with a design item subject to a specific job to be executed by the design engineer, if any, and presenting the content of said document to said design engineer.

17. The system as defined in claim 16, wherein said document is a patent publication.

18. The system as defined in claim 16, which said design-item execution means includes means for allowing any one of the design items which has been completed to be returned to its uncompleted status while keeping obtained data on said design item so as to re-execute said design item.

19. The system as defined in claim 11, wherein said setup means includes means for registering respective costs of said circuit components in a database, and wherein said system includes means for, every time one of said circuit components required for said specific version is determined by said circuit-component determination means, reading out the cost of said determined circuit component from said database, calculating a cumulative cost of the previously determined circuit components, and presenting said cumulative cost to the design engineer.

20. The system as defined in claim 11, which said design-item execution means includes means for allowing any one of the design items which has been completed to be returned to its uncompleted status while keeping obtained data on said design item so as to re-execute said design item.

* * * * *